United States Patent
Shinkawata

(12)
(10) Patent No.: US 6,472,704 B2
(45) Date of Patent: Oct. 29, 2002

(54) SEMICONDUCTOR DEVICE HAVING CONTACT HOLE AND METHOD OF MANUFACTURING THE SAME

(75) Inventor: Hiroki Shinkawata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/756,122

(22) Filed: Jan. 9, 2001

(65) Prior Publication Data

US 2001/0015452 A1 Aug. 23, 2001

Related U.S. Application Data

(62) Division of application No. 09/975,160, filed on Nov. 20, 1997, now Pat. No. 6,194,757.

(30) Foreign Application Priority Data

May 15, 1997 (JP) .............................. 9-125257

(51) Int. Cl.[7] ....................... H01L 27/108; H01L 29/76; H01L 29/94; H01L 31/119
(52) U.S. Cl. ...................................... 257/308; 257/309
(58) Field of Search .................. 257/296, 306–310; 438/253, 396–398, 399

(56) References Cited

U.S. PATENT DOCUMENTS

| | | |
|---|---|---|
| 5,338,700 A | 8/1994 | Dennison et al. |
| 5,389,560 A | 2/1995 | Park |
| 5,506,164 A | 4/1996 | Kinoshita et al. |
| 5,602,051 A | 2/1997 | Cronin et al. |
| 5,710,073 A | 1/1998 | Jeng et al. |
| 5,780,339 A * | 7/1998 | Liu et al. ................ 438/253 |
| 5,804,853 A | 9/1998 | Cronin et al. |
| 5,828,096 A | 10/1998 | Ohno et al. |

FOREIGN PATENT DOCUMENTS

| | | |
|---|---|---|
| DE | 19729602 A1 | 2/1998 |
| JP | 5-136369 | 6/1993 |
| JP | 6-260609 | 9/1994 |
| JP | 8-167700 | 6/1996 |
| JP | 10-308498 | 11/1998 |

OTHER PUBLICATIONS

German Office Action with English translation.
"A High Density 4Mbit DRAM Process Using a Fully Overlapping Bitline Contact (FoBIC) Trench Cell," by Kusters et al., VLSI Technology, May 18–21, 1987, pp. 93–94.

* cited by examiner

*Primary Examiner*—Tom Thomas
*Assistant Examiner*—Thien F Tran
(74) *Attorney, Agent, or Firm*—McDermott, Will & Emery

(57) ABSTRACT

A semiconductor device is obtained which allows a simpler formation process of a capacitor contact hole and reduction in capacitance between bit interconnections. A first capacitor contact hole is formed in a silicon nitride film and an interlayer insulating film in which a bit line contact hole is formed. The first capacitor contact hole is filled with a plug electrode having its top surface area larger than its bottom surface area. A capacitor lower electrode is formed to be connected to the top surface of the plug electrode and to cover the side and top surfaces of a bit line with a sidewall oxide film and a TEOS oxide film located therebetween.

4 Claims, 37 Drawing Sheets

1/4 PITCH LAYOUT

1/2 PITCH LAYOUT

US 6,472,704 B2

SEMICONDUCTOR DEVICE HAVING CONTACT HOLE AND METHOD OF MANUFACTURING THE SAME

This application is a Divisional of application Ser. No. 09/975,160 filed Nov. 20, 1997, now U.S. Pat. No. 6,194,756.

BACKGROUND OF THE INVENTION

1. Field of the Invention

The present invention relates generally to a semiconductor device and a method of manufacturing the same, and more particularly to a semiconductor device having a contact hole and a method of manufacturing the same.

2. Description of the Background Art

A DRAM (Dynamic Random Access Memory) is conventionally well known as a semiconductor memory which is a type of semiconductor devices. FIG. 35 is a cross sectional view showing a conventional DRAM. Referring to FIG. 35, a cross sectional structure of the conventional DRAM will be described first.

In a memory cell portion of the conventional DRAM, an isolation region 102 is provided in a prescribed region at the main surface of a silicon substrate 101. Source/drain regions 106a, 106b and 106c are formed in an active region surrounded by isolation region 102. On a channel region between source/drain regions 106a, 106b, a gate electrode 104a is formed with a gate oxide film 103 therebetween. Gate electrodes 104b and 104c are formed spaced apart from gate electrode 104a by a prescribed distance. A TEOS oxide film 105 is formed to cover the top surfaces of gate electrodes 104a to 104c. A sidewall oxide film 107 is formed to be in contact with side surfaces of gate electrodes 104a to 104c and of TEOS oxide film 105.

A silicon nitride film 108 is formed to cover TEOS oxide film 105, sidewall oxide film 107, and source/drain regions 106a to 106c. An interlayer insulating film 109 is formed on silicon nitride film 108. A bit line contact hole 160 is formed in the region of silicon nitride film 108 and interlayer insulating film 109 located on source/drain region 106b. A bit line 110a is formed to be electrically connected to source/drain region 106b through bit line contact hole 160 and to extend on the top surface of interlayer insulating film 109.

An interlayer insulating film 111 is formed on bit line 110a and interlayer insulating film 109. A capacitor contact hole 161 is formed in the region of silicon nitride film 108 and interlayer insulating films 109, 111 located on source/drain region 106a. A doped polycrystalline silicon film 112 is formed to be electrically connected to source/drain region 106a through capacitor contact hole 161 and to extend on the top surface of interlayer insulating film 111. Doped polycrystalline silicon film 112 includes a vertical part 112a electrically connected to source/drain region 106a and filling contact hole 161, and a horizontal part 112b formed integrally with this vertical part 112a and serving as a capacitor lower electrode.

A sidewall 113 of a doped polycrystalline silicon film is formed to come into contact with both side end surfaces of horizontal part 112b and to extend vertically. Sidewall 113 also serves as the capacitor lower electrode. To cover the top surface of horizontal part 112b and the surface of sidewall 113, a capacitor upper electrode 115 is formed thereon with a capacitor dielectric film 114 therebetween. Capacitor upper electrode 115 includes a doped polycrystalline silicon film. Capacitor lower electrode 112b, 113, capacitor dielectric film 114, and capacitor upper electrode 115 constitute a capacitor. An interlayer insulating film 116 is formed to cover the capacitor. On the top surface of interlayer insulating film 116, metal interconnections 118 are formed spaced apart by a prescribed distance.

On the other hand, in a peripheral circuitry portion, source/drain regions 106d and 106e are formed spaced apart by a prescribed distance at the main surface of silicon substrate 101. On a channel region between source/drain regions 106d, 106e, a gate electrode 104e is formed with gate oxide film 103 therebetween. On the region separated from gate electrode 104e by source/drain region 106d, a gate electrode 104d is formed with gate oxide film 103 therebetween. TEOS oxide film 105 is formed on the top surfaces of gate electrodes 104d and 104e. Sidewall oxide film 107 is formed to come into contact with the side surfaces of gate electrodes 104d and 104e and of TEOS oxide film 105.

Interlayer insulating film 109 is formed to cover source/drain regions 106d, 106e, sidewall oxide film 107, and TEOS oxide film 105. A contact hole is formed in the region of interlayer insulating film 109 located on source/drain region 106d and in the region of interlayer insulating film 109 located on gate electrode 104e. Inside these contact holes, an interconnection layer 110b is formed to be electrically connected to source/drain region 106d and gate electrode 104e. Here, interconnection layer 110b may be connected to either one of source/drain region 106d or gate electrode 104e. Interlayer insulating film 111 is formed to cover interconnection layer 110b, and interlayer insulating film 116 is formed to cover this interlayer insulating film 111. A contact hole is formed in the region of interlayer insulating films 111 and 116 located on a side end of interconnection layer 110b. A metal interconnection 117 is formed to be electrically connected to interconnection layer 110b through the contact hole and to extend along interlayer insulating film 116.

FIG. 36 shows a top plan layout of the entire memory cell portion of the above described conventional DRAM. Referring to FIG. 36, in the memory cell portion of the conventional DRAM, gate electrodes 104a to 104c are formed to extend in parallel, spaced apart by a prescribed distance. In a direction perpendicular to gate electrodes 104a to 104c, bit lines 110a are formed to extend almost in parallel, spaced apart by a prescribed distance. Bit line 110a is connected to source/drain region 106b in an active region 170 through bit line contact hole 160. Doped polycrystalline silicon film 112 serving as the capacitor lower electrode is connected to source/drain region 106a in active region 170 through capacitor contact hole 161.

FIGS. 37 to 53 are cross sectional views illustrating a manufacturing process of the conventional DRAM shown in FIG. 35. Referring to FIGS. 37 to 53, the manufacturing process of the conventional DRAM will be described below.

First, isolation region 102 is formed at the main surface of silicon substrate 101 in the memory cell portion, as shown in FIG. 37. On the main surface of silicon substrate 101, gate oxide films 103 are formed spaced apart by a prescribed distance. Respective gate electrodes 104a, 104b and 104c are formed on gate oxide films 103. In the peripheral circuitry portion as well, gate electrodes 104d and 104e are respectively formed on gate oxide films 103. By ion-implanting an impurity into silicon substrate 101 while using gate electrodes 104a to 104e as a mask, source/drain regions 106a to 106e are formed.

TEOS oxide film 105 is formed on the top surfaces of gate electrodes 104a to 104e. Sidewall oxide film 107 is formed to come into contact with side surfaces of gate electrodes 104a to 104e and of TEOS oxide film 105. By ion-implanting an impurity into source/drain regions 106d and 106e again, while using sidewall oxide film 107 in the peripheral circuitry portion as a mask, source/drain regions 106d and 106e of the LDD structure are completed.

Then, silicon nitride film 108 as an etching stopper layer is formed to cover the entire memory cell portion as shown in FIG. 38. Interlayer insulating film 109 including a silicon oxide film is formed to cover silicon nitride film 108 and the entire peripheral circuitry portion.

Thereafter, contact holes 109a to 109c as shown in FIG. 39 are formed by photolithography and dry etching. In etching for forming contact hole 109a in the memory cell portion, silicon nitride film 108 serves as an etching stopper layer. Then, silicon nitride film 108 in contact hole 109a is removed by etching, and bit line contact hole 160 from the top surface of interlayer insulating film 109 to source/drain region 106b is formed as shown in FIG. 40. Thereafter, interconnection layer 110 of a tungsten polyside layer, for example, is formed as shown in FIG. 41. By patterning this interconnection layer 110, bit line 110a of the memory cell portion and interconnection layer 110b of the peripheral circuitry portion are formed as shown in FIG. 42.

Then, interlayer insulating film 111 is formed to cover the entire surface, as shown in FIG. 43. As shown in FIG. 44, a polycrystalline silicon film 150 is formed on interlayer insulating film 111, and then a TEOS oxide film 151 is formed on polycrystalline silicon film 150. Thereafter, an opening 151a is formed in a prescribed region of TEOS oxide film 151.

After a TEOS oxide film (not shown) is formed to cover TEOS oxide film 151 and opening 151a, TEOS oxide film 151 is subjected to anisotropic etching to form a sidewall film 152 as shown in FIG. 45. By using the sidewall film 152 as a mask and by etching polycrystalline silicon film 150 located under the sidewall film, an opening 150a which is smaller in diameter than opening 151a by thickness of two sidewalls 152 can be formed. By anisotropic etching of interlayer insulating films 111 and 109 located below through this opening 150a, capacitor contact hole 161 as shown in FIG. 46 is formed.

Thereafter, a resist 153 is filled inside capacitor contact hole 161. This resist 153 is provided to protect the surface of silicon substrate 101 located at the bottom of capacitor contact hole 161 when polycrystalline silicon film 150 is removed by etching in a subsequent process. Polycrystalline silicon 150 is removed while this resist 153 is provided. As shown in FIG. 47, doped polycrystalline silicon film 112 is then formed filling capacitor contact hole 161 and extending along the top surface of interlayer insulating film 111. A BPSG oxide film 154 is formed on doped polycrystalline silicon film 112.

Thereafter, BPSG oxide film 154 and doped polycrystalline silicon film 112 are patterned by photolithography and dry etching to obtain the shape of the memory cell portion as shown in FIG. 48. Then, a doped polycrystalline silicon film 113 as shown in FIG. 49 is formed to cover BPSG oxide film 154 and interlayer insulating film 111. By anisotropic etching of doped polycrystalline silicon film 113, a sidewall 113a of a doped polycrystalline silicon film as shown in FIG. 50 is formed. Thereafter, BPSG oxide film 154 is removed to obtain the shape as shown in FIG. 51.

Then, as shown in FIG. 52, capacitor dielectric film 114, and doped polycrystalline silicon film 115 serving as the capacitor upper electrode are formed to cover doped polycrystalline silicon film 112, sidewall 113a and interlayer insulating film 111. By patterning capacitor dielectric film 114 and doped polycrystalline silicon film 115, the capacitor structure is then obtained as shown in FIG. 53.

Thereafter, interlayer insulating film 116 is formed on interlayer insulating film 111 of the peripheral circuitry portion and on capacitor upper electrode 115 of the memory cell portion as shown in FIG. 35. A contact hole is formed in the region of interlayer insulating films 116 and 111 of the peripheral circuitry portion located on interconnection layer 110b. Then, metal interconnection 117 is formed filling the contact hole and extending along the top surface of interlayer insulating film 116. In the memory cell portion as well, metal interconnections 118 are formed spaced apart by a prescribed distance on interlayer insulating film 116. Thus, the conventional DRAM is formed.

In the conventional DRAM shown in FIG. 35, reduction in the memory cell portion area is required as a semiconductor device is integrated to a higher degree. In this case, capacitor contact hole 161 and bit line contact hole 160 have to be formed in a very small active region. To satisfy these requirements, a technique for opening a contact hole in a self-alignment manner has been required. As such a self aligned contact opening method, a contact opening method using a silicon nitride film as an etching stopper is conventionally well known.

In the conventional structure shown in FIG. 35, bit line contact hole 160 is formed by the above mentioned self aligned contact opening method of a silicon nitride film. Specifically, as shown in FIG. 38, silicon nitride film 108 is formed and thereafter interlayer insulating film 109 of a silicon oxide film is formed thereon. By etching the portion of interlayer insulating film 109 located over source/drain region 106b while using silicon nitride film 108 as the etching stopper layer as shown in FIG. 39, contact hole 109a is formed in a self-alignment manner. Thereafter, nitride film 108 in contact hole 109a is removed to form bit line contact hole 160 as shown in FIG. 40. Conventionally, the self-aligned contact opening method using silicon nitride film 108 has been used to form bit line contact hole 160.

However, such an opening method using silicon nitride film 108 as an etching stopper layer is applicable only to a contact hole having a smaller depth as contact hole 109a shown in FIG. 39 because of following reasons. That is, although a selection ratio of a silicon oxide film and a silicon nitride film (an etching rate of the silicon oxide film/an etching rate of the silicon nitride film) is approximately 30 in theory, etching progresses faster in a stepped part than in a flat part of silicon nitride film. 108. Therefore, the selection ratio of the silicon nitride film to the silicon oxide film is reduced to approximately 10 to 15 in the stepped part.

When a contact hole having a larger depth (larger aspect ratio) like, for example, capacitor contact 161 is opened by using silicon nitride film 108 as an etching stopper layer while such a selection ratio is taken, it takes longer time to etch silicon nitride film 108 due to a process margin. Therefore, when a contact hole having a larger depth as capacitor contact hole 161 is opened, the stepped part of silicon nitride film 108 under the hole is completely scraped off and TEOS oxide film 105 located on gate electrode 104 is scraped off. Thus, that gate electrode 104c is exposed. When doped polycrystalline silicon film 112 serving as the capacitor lower electrode is formed in capacitor contact hole 161 in this case, doped polycrystalline silicon film 112 and gate electrode 104c undesirably cause a short circuit.

Therefore, the self aligned opening method using silicon nitride film 108 has been adapted for forming bit line contact hole 160 having a smaller depth, and the diameter reduction process shown in FIGS. 44 to 46 has been used for forming capacitor contact hole 161.

In the above mentioned diameter reduction process, however, the number of steps is increased and the manufacturing process becomes complicated as compared with the self aligned opening method using a silicon nitride film stopper. Since reduction in contact diameter of capacitor contact hole 161 is required as a memory cell becomes smaller, it is technically difficult to form a contact hole having a larger depth and a smaller contact diameter as shown in FIG. 35.

Further, as the memory cell portion becomes smaller, the space between adjacent bit lines 160a shown in FIG. 36 becomes narrower. When the space between bit lines 110a is narrower, capacitance between bit interconnections (Cb) becomes larger, delaying data reading and writing. As a result, high speed access becomes difficult. In the conventional structure shown in FIG. 36, vertical part 112a of doped polycrystalline silicon film 112 is located between adjacent bit lines 110a. However, since the outer diameter of this vertical part 62a is small, it does not reduce capacitance between adjacent bit lines 110a.

SUMMARY OF THE INVENTION

An object of the present invention is to provide a structure allowing easy manufacture of a capacitor contact hole and reduction in capacitance between bit interconnections in a semiconductor device.

Another object of the present invention is to form a capacitor contact hole in a self-alignment manner and to easily manufacture a structure allowing reduction in capacitance between bit interconnections, in a manufacturing method of a semiconductor device.

A semiconductor device in accordance with a first aspect of the present invention includes a pair of first and second source/drain regions, a gate electrode, a first etching stopper layer, a first interlayer insulating film, a bit line opening, a first capacitor opening, a bit line, a plug electrode, and a capacitor lower electrode. The first and second source/drain regions are formed spaced apart with a channel region therebetween at the main surface of a semiconductor region. The gate electrode is formed on the channel region. The first etching stopper layer is formed on the gate electrode and it includes an insulating film. The first interlayer insulating film is formed on the first etching stopper layer. The bit line opening is formed in the region of the first interlayer insulating film and the first etching stopper layer located on the first source/drain region. The first capacitor opening is formed in the region of the first interlayer insulating film and the first etching stopper layer located on the second source/drain region. The bit line is connected to the first source/drain region through the bit line opening. The plug electrode is connected to the second source/drain region through the first capacitor opening and formed to fill the first capacitor opening. In the plug electrode, its top surface area is larger than its bottom surface area. The capacitor lower electrode is electrically connected to the top surface of the plug electrode and formed to cover the top and side surfaces of the bit line with the first insulating film located therebetween.

In the semiconductor device in according with the first aspect, as described above, the first capacitor opening is provided in the first interlayer insulating film and the second etching stopper layer where the bit line opening is formed, and the plug electrode is filled in the first capacitor opening, so that the first capacitor opening can be formed at the same aspect ratio (depth) as the bit line opening. Therefore, the first capacitor opening can be formed by the self aligned contact opening method using the first etching stopper layer. Accordingly, the manufacturing process can be made simpler as compared with the case where the diameter reduction process is used for forming a capacitor opening, and the capacitor contact can be formed easily even if a memory cell becomes smaller. By providing the capacitor lower electrode covering the top and side surfaces of the bit line with the first insulating film located therebetween, the capacitor lower electrode is located between adjacent bit lines, allowing substantial reduction in capacitance between bit interconnections as compared with a structure where only a normal contact portion is placed between adjacent bit lines. Therefore, delay in reading and writing of data from and to a memory cell can be prevented. As a result, high speed access is allowed. In the semiconductor device, the top surface area of the plug electrode connected to the capacitor lower electrode is larger than the bottom surface area of the plug electrode connected to the second source/drain region. Therefore, a sufficient offset margin is ensured for forming the capacitor lower electrode to be connected to the top surface of the flat electrode. As a result, the process of forming the capacitor lower electrode becomes easier.

A semiconductor device in accordance with another aspect of the present invention includes a pair of first and second source/drain regions, a gate. electrode, a first etching stopper layer, a first interlayer insulating film, a bit line opening, a first capacitor opening, a bit line, a plug electrode, and a conductive layer. The first and second source/drain regions are formed spaced apart with a channel region therebetween at the main surface of a semiconductor region, and the gate electrode is formed on the channel region. The first etching stopper layer is formed on the gate electrode, and it includes an insulating film. The first interlayer insulating film is formed on the first etching stopper layer. The bit line opening is formed in the region of the first interlayer insulating film and the first etching stopper layer located on the first source/drain region. The first capacitor opening is formed in the region of the first interlayer insulating film and the first etching stopper layer located on the second source/drain region. The bit line is connected to the first source/drain region through the bit line opening. The plug electrode is connected to the second source/drain region through the first capacitor opening and formed to fill the first capacitor opening. The top surface area of the plug electrode is larger than the bottom surface area. The conductive layer has a capacitor contact portion electrically connected to the top surface of the plug electrode and extending vertically, and a capacitor lower electrode formed integrally with the top of the capacitor contact portion and extending horizontally. The capacitor contact portion of the conductive layer is formed to cover the top and side surfaces of the bit line with the first insulating film located therebetween.

In the semiconductor device in accordance with the aforementioned another aspect, the first capacitor opening is formed in the first interlayer insulating film and the first etching stopper layer where the bit line opening is formed, and the plug electrode is filled in the first capacitor opening, so that the first capacitor opening can be formed at the same aspect ratio as the bit line opening. As a result, the self aligned opening method using the first etching stopper layer can be adapted for forming the first capacitor opening. Accordingly, the manufacturing process can be made simpler as compared with the case where the first capacitor opening is formed by the diameter reduction process, and it can also easily be formed when memory cell size is smaller. By forming part of the capacitor contact portion of the conductive layer electrically connected to the top surface of the plug electrode to cover the top and side surfaces of the bit line, the capacitor contact portion is located between adjacent bit lines. Thus, the area of that portion which shields the space between adjacent bit lines is larger as compared with a conventional structure where the contact portion having a normal contact diameter is placed between bit lines. Therefore, capacitance between adjacent bit lines can effectively be prevented from becoming larger. As a result, delay in data reading and writing can be prevented, enabling high speed access. In the semiconductor device in accordance with this aspect, the top surface area of the plug electrode connected to the capacitance lower electrode is larger than the bottom surface area of the plug electrode connected to the second source/drain region. Therefore, there is a sufficient offset margin for forming the capacitor lower electrode to be connected the top surface of the plug electrode. As a result, the process of forming the capacitor lower electrode becomes easier.

In the structure of the semiconductor device in accordance with the first or another aspect, the first insulating film may include an upper insulating film formed in contact with the top surface of the bit line, and a sidewall insulating film formed in contact with side surfaces of the bit line and the upper insulating film. In addition, the top surface of the bit line may be located above the top surface of the plug electrode. By this structure, the capacitor lower electrode covering the side and top surfaces of the bit line can easily be formed.

In the structure of the semiconductor device in accordance with the first or another aspect, the surface of the capacitor lower electrode may have irregularity. By this structure, the surface area of the capacitor lower electrode is increased, allowing increase in capacitor capacitance.

In the structure of the semiconductor device in accordance with the aforementioned another aspect, a second etching stopper layer, a second interlayer insulating film, and a second capacitor opening may further be provided. In this case, the second etching stopper layer is formed on the first interlayer insulating film and the first insulating film, and it includes an insulting film. The second interlayer insulating film is formed on the second etching stopper layer. The second capacitor opening is formed in the second interlayer insulating film and second etching stopper layer to reach the first capacitor opening. Further, an end of the second etching stopper layer located between the second interlayer insulating film and the first insulating film is removed on the side of the second capacitor opening to form a concave portion over a top side end of the bit line. The capacitor contact portion is formed to fill the second capacitor opening and the concave portion and to extend over the bit line. The capacitor lower electrode is formed to extend along the top surface of the second interlayer insulating film. Thus, by forming the concave portion in the region of the second capacitor opening located over the top side end of the bit line, and filling the concave portion and the second capacitor opening with the capacitor contact portion, the capacitor contact portion covering the side end and top surfaces of the bit line can easily be formed.

A method of manufacturing a semiconductor device in accordance with yet another aspect of the present invention includes following steps. A pair of first and second source/ drain regions and a gate electrode are formed at and on the main surface of a semiconductor region. A first silicon nitride film is formed to cover the gate electrode. A first interlayer insulating film of a silicon oxide film is formed on the first silicon nitride film. A first opening is formed by etching the region of the first interlayer insulating film located over the first source/drain region while using the first silicon nitride film as an etching stopper layer. By etching the first silicon nitride film in the first opening, a first capacitor opening is formed extending from the top surface of the first interlayer insulating film to the first source/drain region. A plug electrode is formed to fill the first capacitor opening and to be electrically connected to the first source/ drain region. A second opening is formed by etching the region of the first interlayer insulating film located over the second source/drain region while, using the first silicon nitride film as an etching stopper layer. By etching the first silicon nitride film in the second opening, a bit line opening is formed extending from the top surface of the first interlayer insulating film to the second source/drain region. A bit line is formed to be electrically connected to the second source/drain region through the bit line opening and to extend on the first interlayer insulating film. A first insulating film is formed to cover the top and side surfaces of the bit line. A capacitor lower electrode is formed to be electrically connected to the top surface of the plug electrode and to cover the top and side surfaces of the bit line with the first insulating film located therebetween.

In the method of manufacturing in accordance with yet another aspect, the first capacitor opening is formed in the first silicon nitride film and the first interlayer insulating film where the bit line opening is formed, so that the self-aligned opening method using the first silicon nitride film as an etching stopper layer can be used for forming the first capacitor opening. Since the first capacitor opening can be formed in a self-alignment manner by using the first silicon nitride film, the manufacturing process can be made simpler as compared with the case where the first capacitor opening is formed by the diameter reduction process, and the first capacitor opening can easily be formed even if a memory cell becomes smaller. By forming the capacitor lower electrode formed on the top surface of the plug electrode to cover the top and side surfaces of the bit line, the capacitor lower electrode is located between adjacent bit lines. As a result, the semiconductor device which can reduce capacitance between bit interconnections can easily be manufactured.

A manufacturing method in accordance with a further aspect of the present invention includes following steps. A pair of first and second source/drain regions and a gate electrode are formed at and on the main surface of a semiconductor region. A first silicon nitride film is formed to cover the gate electrode. A first interlayer insulating film of a silicon oxide film is formed on the first silicon nitride film. A first opening is formed by etching the region of the first interlayer insulating film located over the first source/drain region while using the first silicon nitride film as an etching stopper layer. By etching the first silicon nitride film in the first opening, a first capacitance opening is formed extending from the top surface of the first interlayer insulating film to the first source/drain region. A plug electrode is formed to fill the first capacitor opening and to be electrically connected to the first source/drain region. A second opening is formed by etching the region of the first interlayer insulating film located over the second/drain region while using the first silicon nitride film as an etching stopper layer. By etching the first silicon nitride film in the second opening, a bit line opening is formed extending from the top surface of the first interlayer insulating film to the second source/drain region. A bit line is formed electrically connected to the second source/drain region through the bit line opening and extending on the first interlayer insulating film. A first insulating film is formed to cover the top and side surfaces of the bit line. A second silicon nitride film is formed to cover the first interlayer insulating film and the first insulating film. A second interlayer insulating film of a silicon oxide film is formed on the second silicon nitride film. A third opening is formed by etching the region of the second interlayer insulating film located on the plug electrode while using the second silicon nitride film as a mask. By etching the second silicon nitride film in the third opening, a second capacitor opening is formed extending from the top surface of the second interlayer insulating film to the top surface of the plug electrode, and a concave portion is formed in the region of the second capacitor opening located over the top side end of the bit line. A conductive layer is formed which has a capacitor contact portion filling the concave portion and the second capacitor contact, and a capacitor lower electrode extending on the top surface of the second interlayer insulating film.

According to the aforementioned further aspect of the manufacturing method, the first capacitor opening is formed in the first silicon nitride film and the first interlayer insulating film where the bit line opening is formed, so that the self aligned opening method using the first silicon nitride film as an etching stopper layer can be used for forming the first capacitor opening. Accordingly, the manufacturing process can be made simpler as compared with the case where the first capacitor opening is formed by the diameter reduction process, and the first capacitor opening can be formed easily even if a cell becomes smaller. By filling the concave portion formed over the top side end of the bit line with the capacitor contact portion, the capacitor contact portion covering the side and top surfaces of the bit line can easily be formed. Accordingly, the capacitor contact portion is located between adjacent bit lines, and the area of the portion shielding the space between adjacent bit lines is larger as compared with a conventional contact portion. Therefore, capacitance between bit interconnections can be made larger than the prior art. As a result, the semiconductor device can easily be manufactured which can prevent delay in reading and writing of data to and from a memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with respect to the drawings.

First Embodiment

Figure 1:
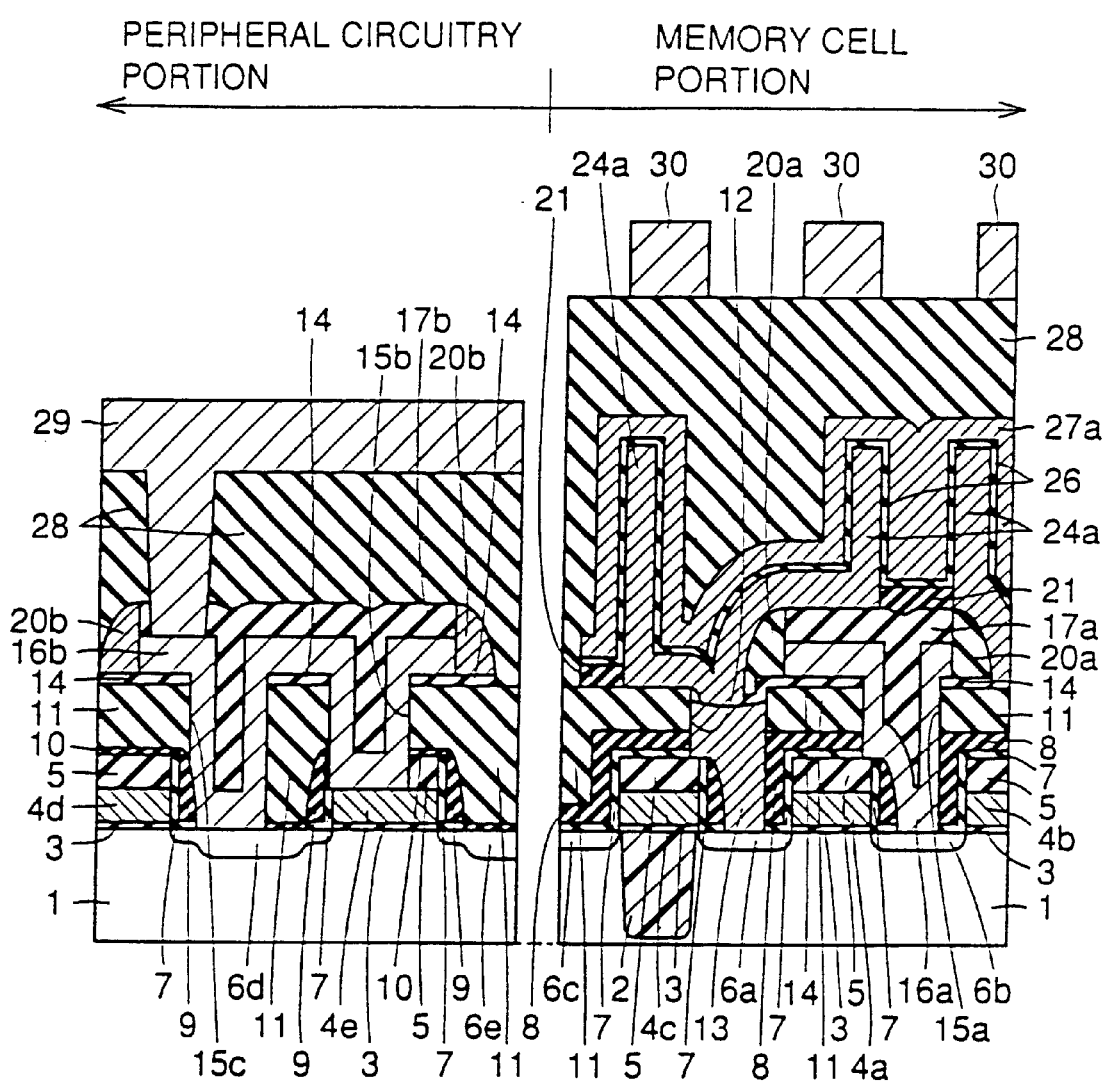
FIG. 1 is a cross sectional view showing a DRAM in accordance with a first embodiment of the present invention.

Referring to FIG. 1; in a memory cell portion of a DRAM in accordance with a first embodiment, an isolation region 2 is formed in a prescribed region at the main surface of a silicon substrate 1. Isolation region 2 is formed by forming a trench and filling the trench with an oxide film. A normal LOCOS isolation oxide film may be used for isolation region 2. In an active region surrounded by isolation region 2, source/drain regions 6a, 6b and 6c are formed spaced apart by a prescribed distance. On the channel region between source/drain regions 6a, 6b, a gate electrode 4a is formed with a gate oxide film 3 therebetween. Gate electrodes 4b and 4c are formed spaced apart from gate electrode 4a by a prescribed distance.

A TEOS oxide film 5 is formed on the top surfaces of gate electrodes 4a, 4b and 4c. A TEOS oxide film 7 having a thickness of approximately 10 nm to approximately 20 nm is formed to cover gate electrodes 4a to 4c and TEOS oxide film 5. A silicon nitride film 8 having a thickness of approximately 30 to approximately 50 nm is formed to cover TEOS oxide film 7. An interlayer insulating film 11 of a BPSG oxide film or a PSG oxide film is formed on silicon nitride film 8. A capacitor contact hole 12 is formed in the region of interlayer insulating film 11 and silicon nitride film 8 located on source/drain region 6a. Further, a bit line contact hole 15a is formed in the region of silicon nitride film 8 and interlayer insulating film 11 located on source/drain region 6b.

A plug electrode 13 of a polycrystalline silicon film is filled in capacitor contact hole 12. A TEOS oxide film 14 having a thickness of approximately 30 nm is formed to cover interlayer insulating film 11. An opening is formed in the region of TEOS oxide film 14 located on plug electrode 13 and in the region of TEOS oxide film 14 located on bit line contact hole 15a. A bit line 16a is formed to be electrically connected to source/drain region 6b in bit line contact hole 15a and to extend along the top surface of TEOS oxide film 14. A TEOS oxide film 17a having a thickness of approximately 100 nm to approximately 200 nm is formed on the top surface of bit line 16a. A sidewall oxide film 20a of a TEOS oxide film is formed to be in contact with side surfaces of TEOS oxide film 17a and bit line 16a.

A capacitor lower electrode 24a of a polycrystalline silicon film is formed to be electrically connected to the top surface of plug electrode 13 and to extend along the top surfaces of sidewall oxide film 20a and TEOS oxide film 17a. Capacitor lower electrode 24a is formed to have a cylindrical structure extending vertically on its both sides. A silicon nitride film 21 is formed between adjacent capacitor lower electrodes 24a. A capacitor dielectric film 26 is formed to cover capacitor lower electrode 24a. A capacitor upper electrode 27a of a polycrystalline silicon film is formed to cover capacitor dielectric film 26 and silicon nitride film 21. An interlayer insulating film 28 of, for example, a TEOS film or a BPSG oxide film is formed to cover capacitor upper electrode 27a. On the top surface of interlayer insulating film 28, metal interconnections 30 are formed spaced apart by a prescribed distance.

On the other hand, in a peripheral circuitry portion, source/drain regions 6d and 6e are formed spaced apart by a prescribed distance at the main surface of silicon substrate 1. On a channel region between source/drain regions 6d, 6e, a gate electrode 4e is formed with gate oxide film 3 therebetween. In a region separated from gate electrode 4e by source/drain region 6d, a gate electrode 4d is formed on gate oxide film 3. TEOS oxide film 5 is formed on the top surfaces of gate electrodes 4d and 4e. TEOS oxide film 7 having a thickness of approximately 10nm to approximately 20 nm is formed to come into contact with side surfaces of gate electrodes 4d, 4e and TEOS oxide film 5. A sidewall insulating film 9 of a silicon nitride film is formed at a side of TEOS oxide film 7. The sidewall oxide film 9 is used for forming source/drain regions 6d and 6e each having the LDD (Lightly Doped Drain) structure.

An insulating film 10 of a silicon nitride film is formed on TEOS oxide film 5. Here, insulating film 10 may be formed of a TEOS oxide film. Interlayer insulating film 11 is formed to cover the entire surface. TEOS oxide film 14 is formed on interlayer insulating film 11. A contact hole is formed in the region of interlayer insulating film 11 and TEOS oxide film 14 located on source/drain region 6d and in the region of interlayer insulating film 11 and TEOS oxide film 14 located on gate electrode 4e. An interconnection layer 16b is formed to electrically connect source/drain region 6d and gate electrode 4e through the contact holes. Interconnection layer 16b may be connected to either one of source/drain region 6d or gate electrode 4e. A TEOS oxide film 17b is formed to cover the top surface of interconnection layer 16e. A sidewall oxide film 20b of a TEOS oxide film is formed to come into contact with a side surface of interconnection layer 16b and TEOS oxide film 17b.

Interlayer insulating film 28 is formed to cover sidewall oxide film 20b and TEOS oxide film 17b. A contact hole is formed in the region of interlayer insulating film 28 and TEOS oxide film 17b located on a side end of interconnection layer 16b. A metal interconnection 29 is formed to be electrically connected to interconnection layer 16b through the contact hole and to extend along the top surface of interlayer insulating film 28.

Here, gate electrodes 4a to 4c in the memory cell portion and gate electrodes 4d and 4e in the peripheral circuitry portion are formed by patterning the same layer. Bit line 16a of the memory cell portion and interconnection layer 16b of the peripheral circuitry portion are formed by patterning the same layer.

Figure 44:
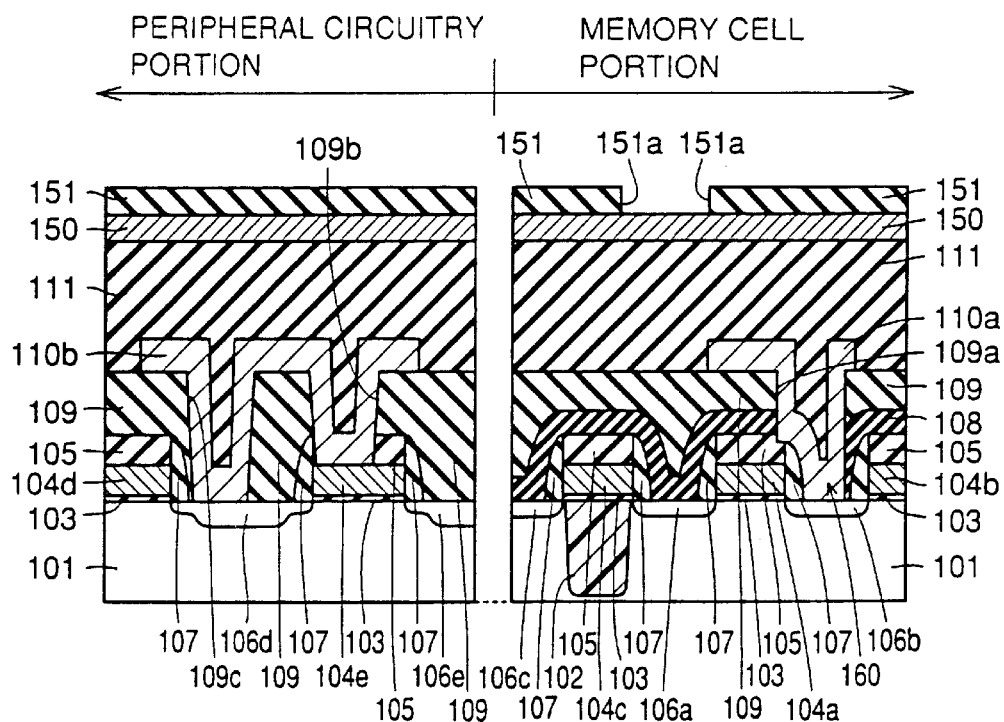
Figure 45:
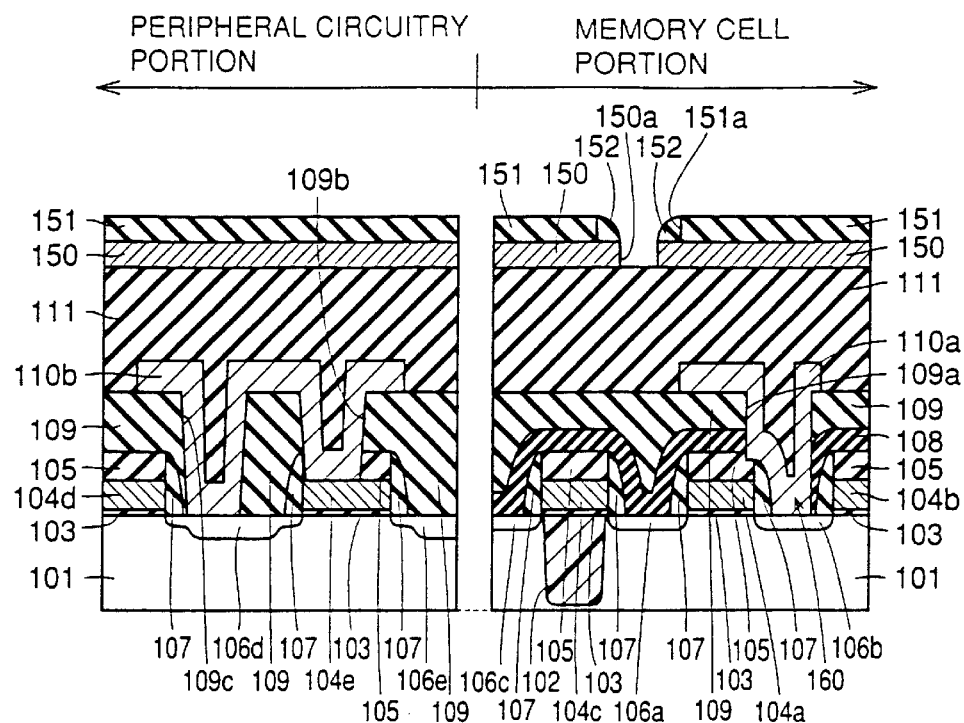
Figure 46:
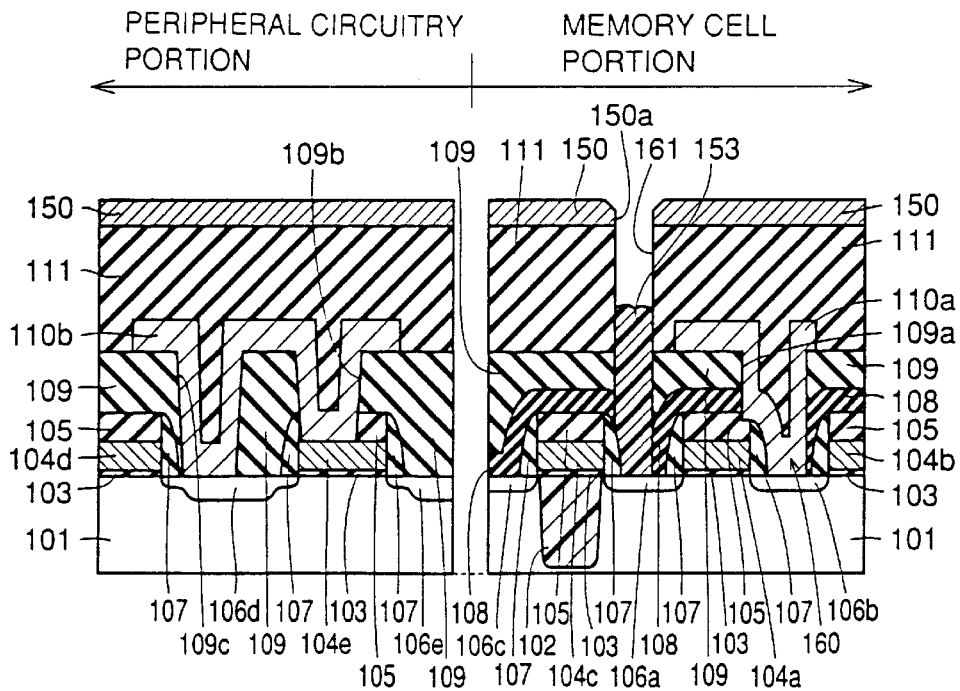
Figure 47:
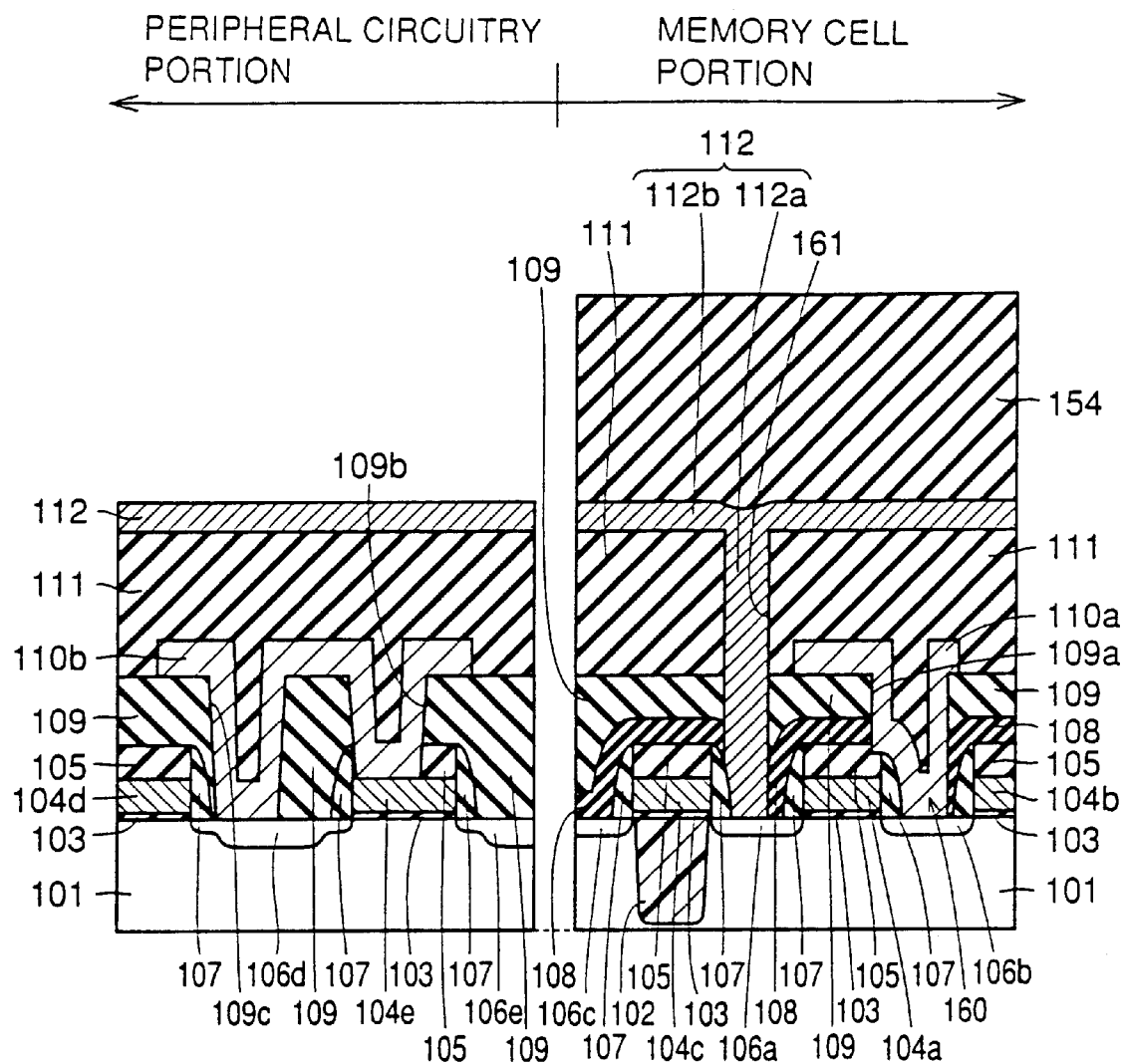
Figure 48:
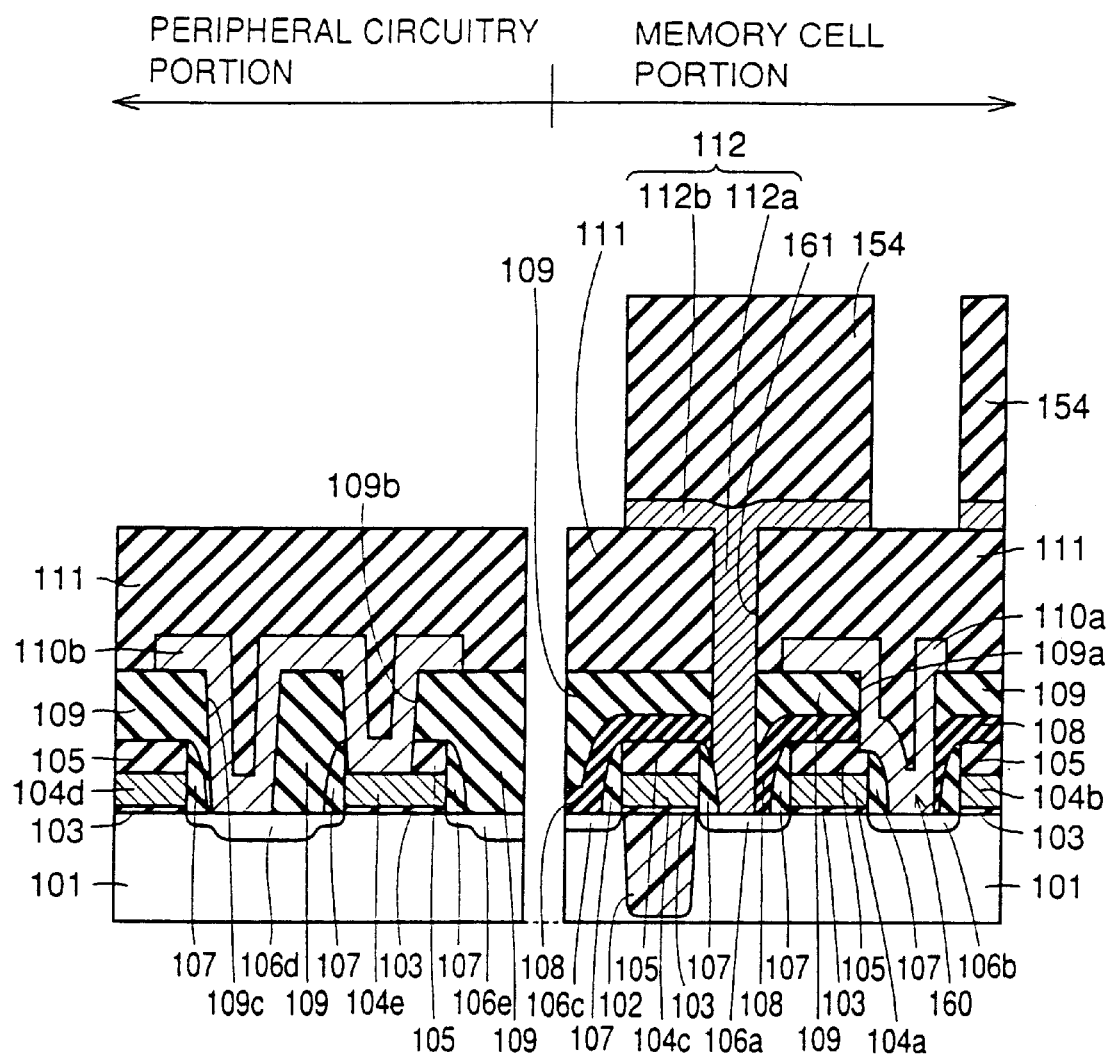
Figure 49:
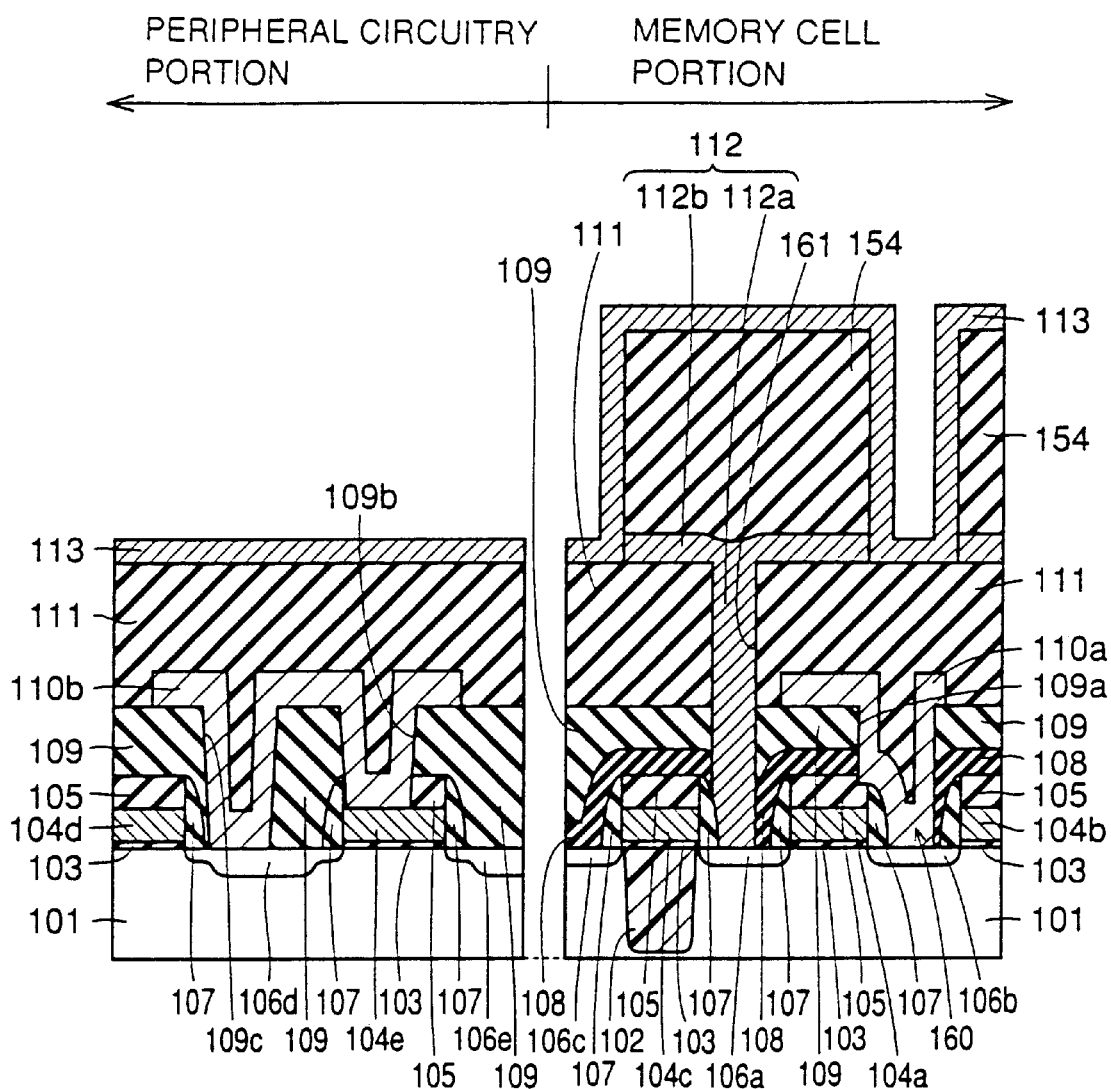
Figure 50:
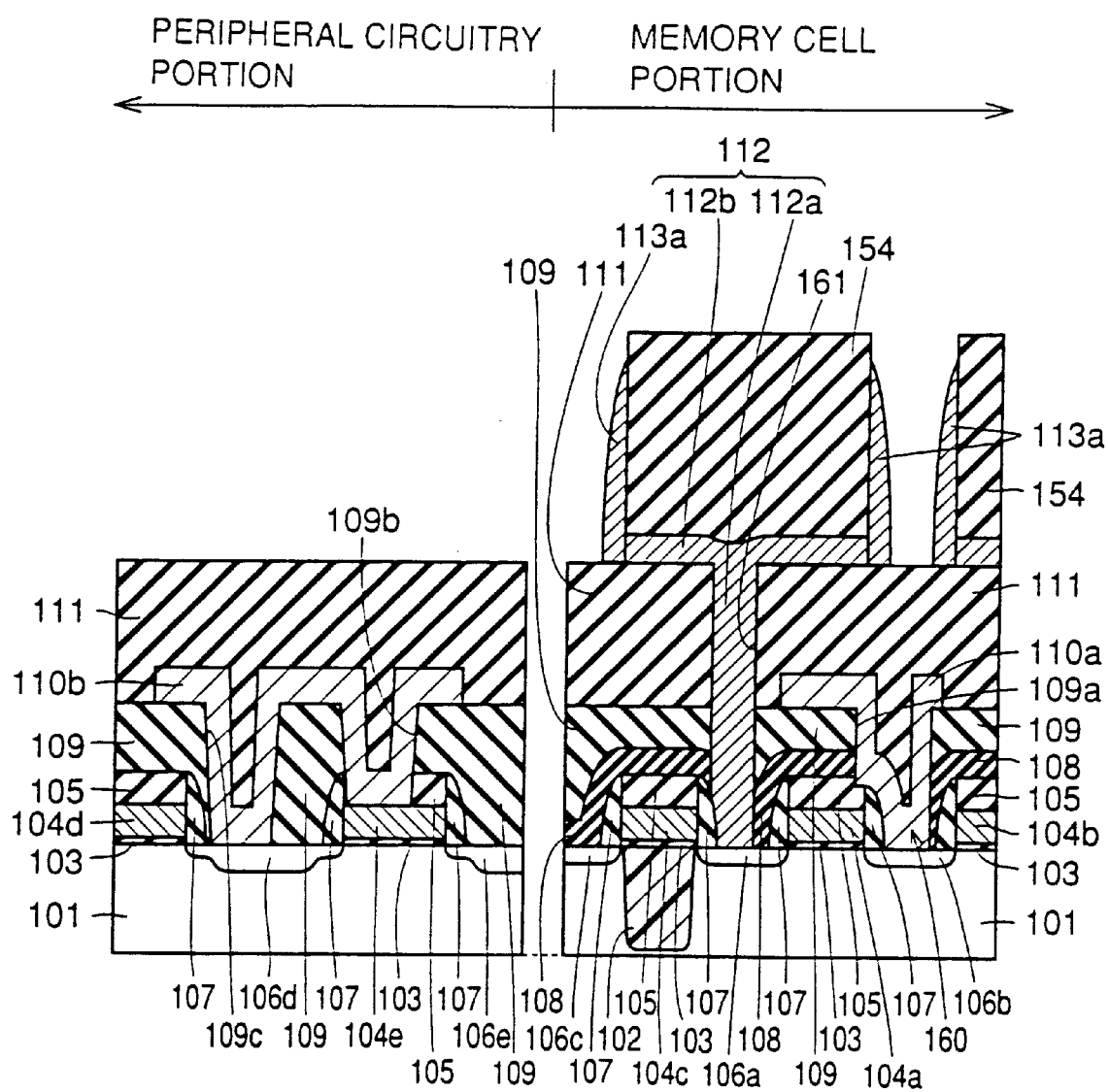
Figure 51:
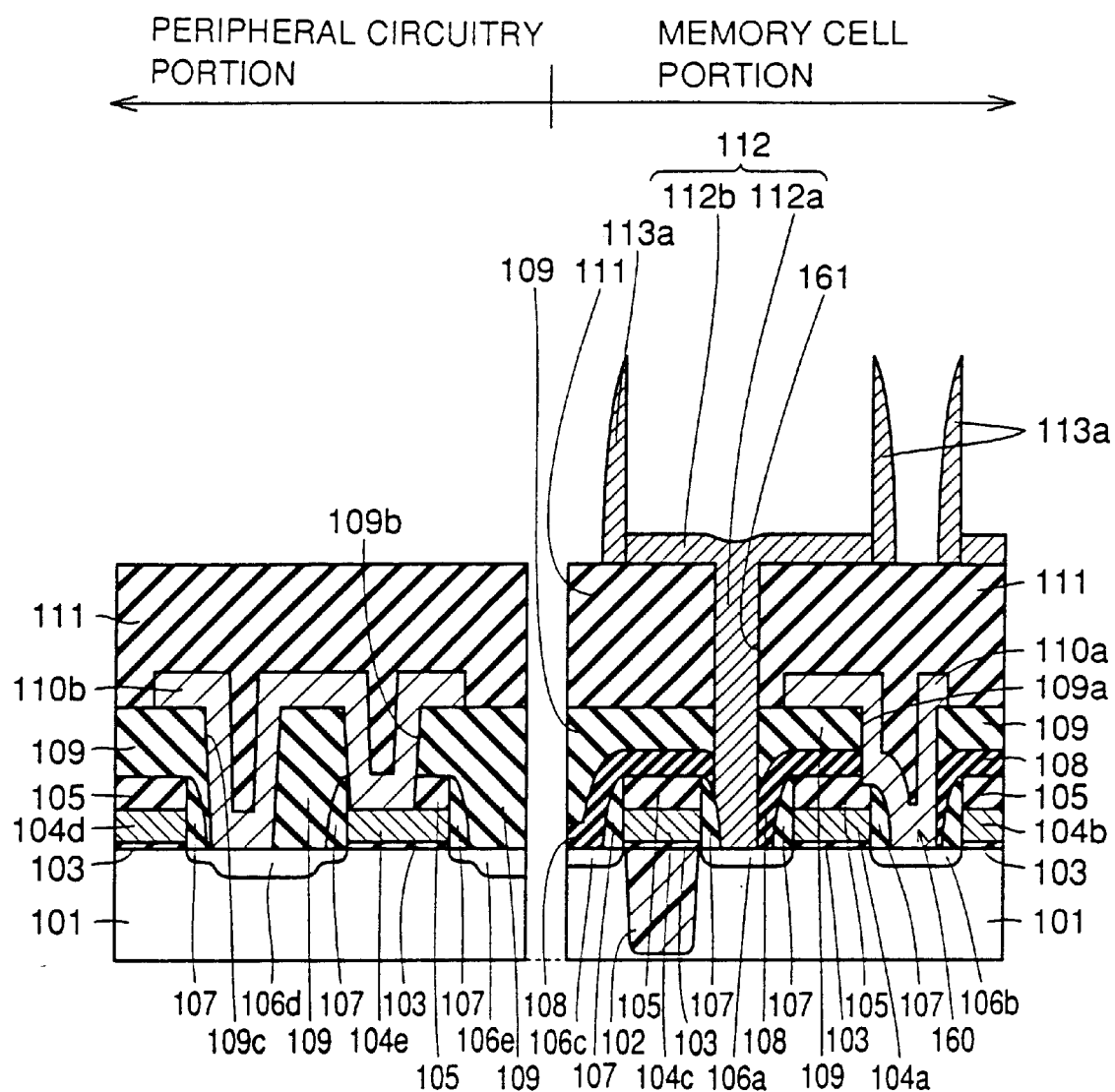
Figure 52:
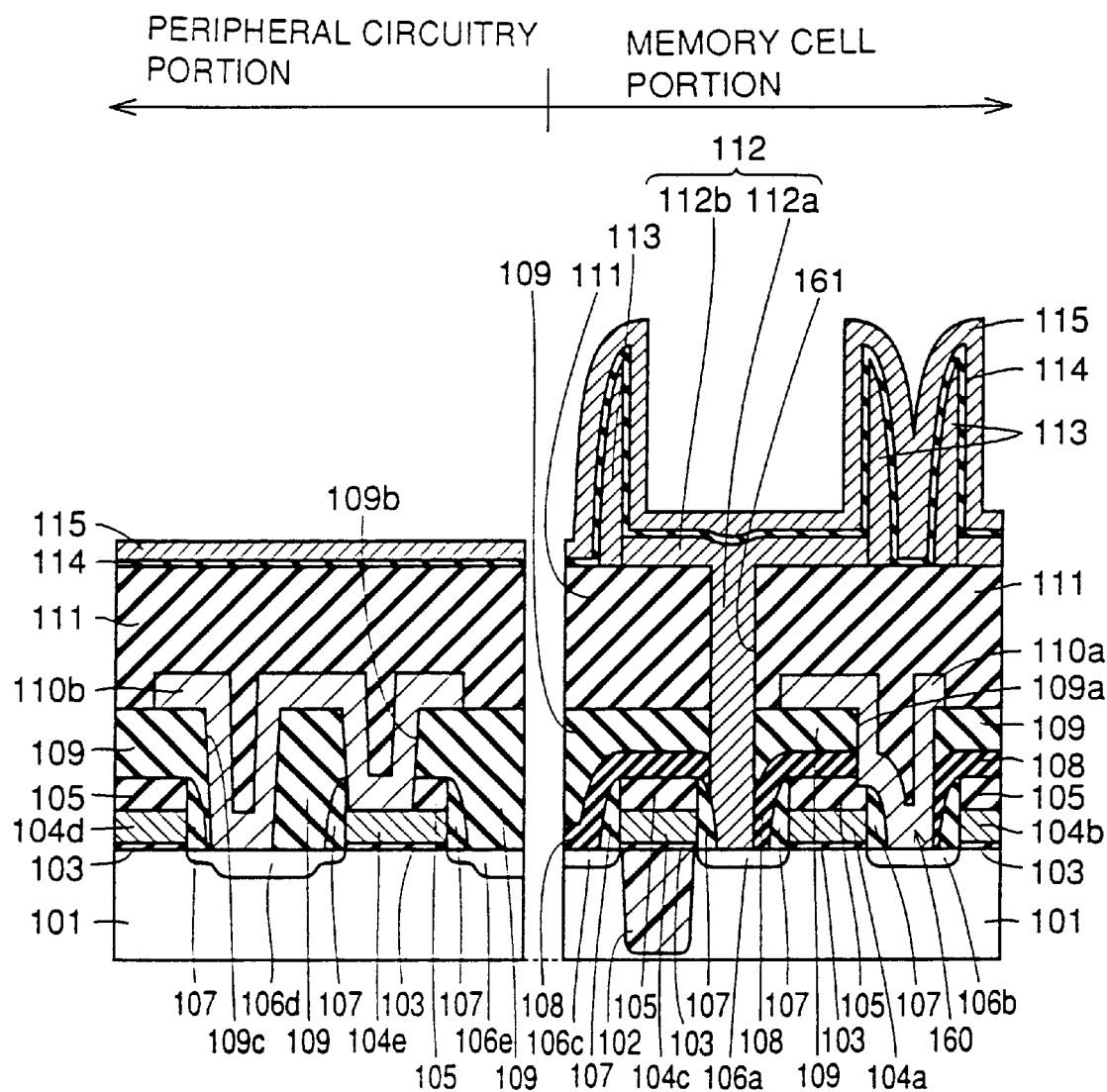
Figure 53:
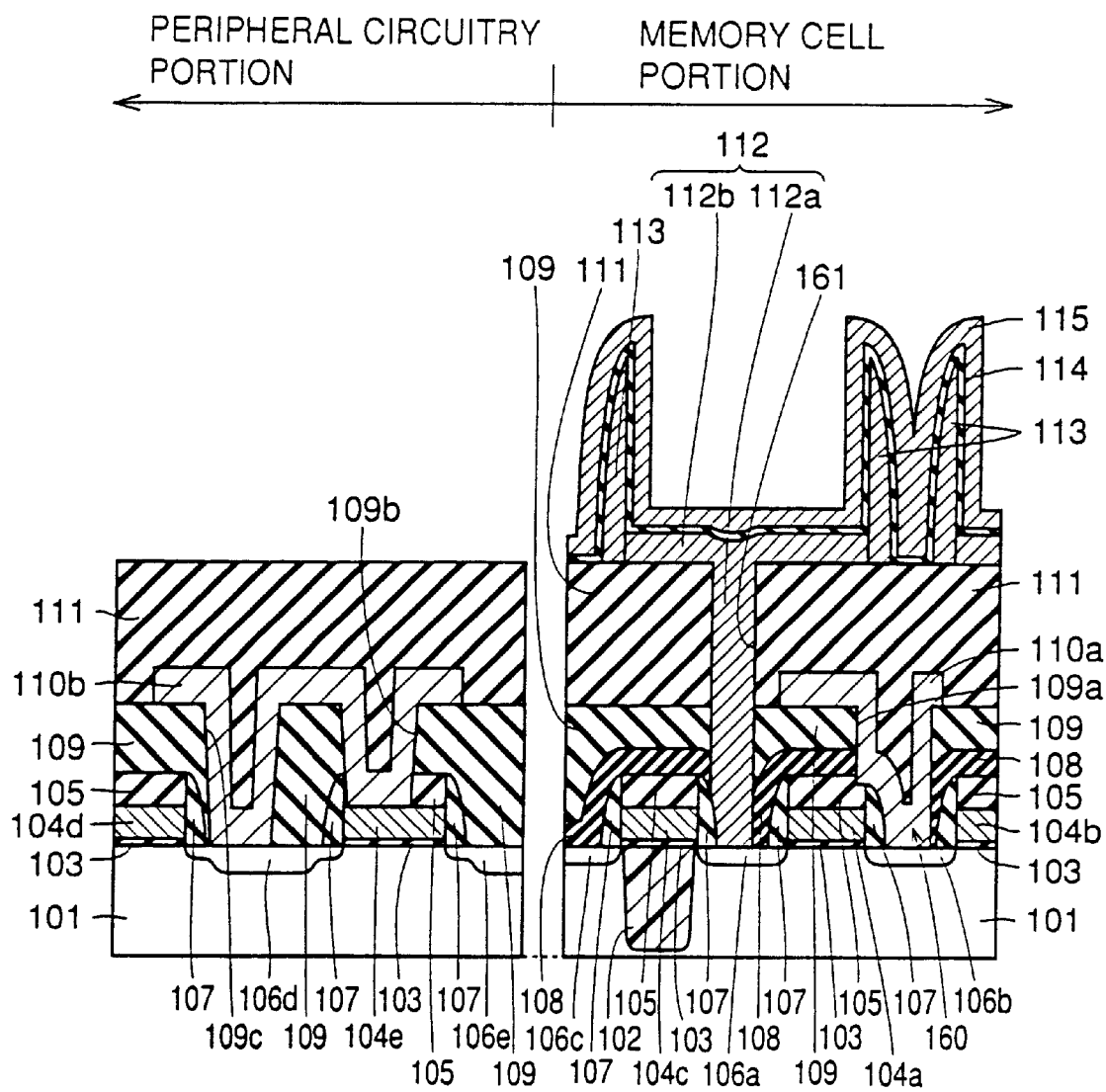

In the DRAM in accordance with the first embodiment, plug electrode 13 is located between capacitor lower electrode 24a and source/drain region 6. Plug electrode 13 is formed to fill capacitor contact hole 12 having the same aspect ratio (depth) as bit line contact hole 16a. Therefore, as described with respect to a manufacturing process below, capacitor contact hole 12 can be formed with the same small aspect ratio as bit line contact hole 16a in the structure of the first embodiment. Thus, capacitor contact hole 12 can be formed by the self aligned opening method using silicon nitride film 8 as an etching stopper. As a result, the manufacturing process can be made simpler as compared with the case where capacitor contact hole 161 is formed by the conventional diameter reduction process described with respect to FIGS. 44 to 46. Further, by the self aligned opening method using silicon nitride film 8, capacitor contact hole 12 can easily be formed even if a memory cell becomes smaller.

In the structure of the first embodiment, the area of the top surface of plug electrode 13 connected to capacitor lower electrode 24a is larger than the area of the bottom surface of plug electrode 13 connected to source/drain region 6a. Therefore, a sufficient displacement margin can be ensured for forming capacitor lower electrode 24a to be connected to the top surface of plug electrode 13. As a result, the process of forming capacitor lower electrode 24a becomes simpler.

Figure 2:
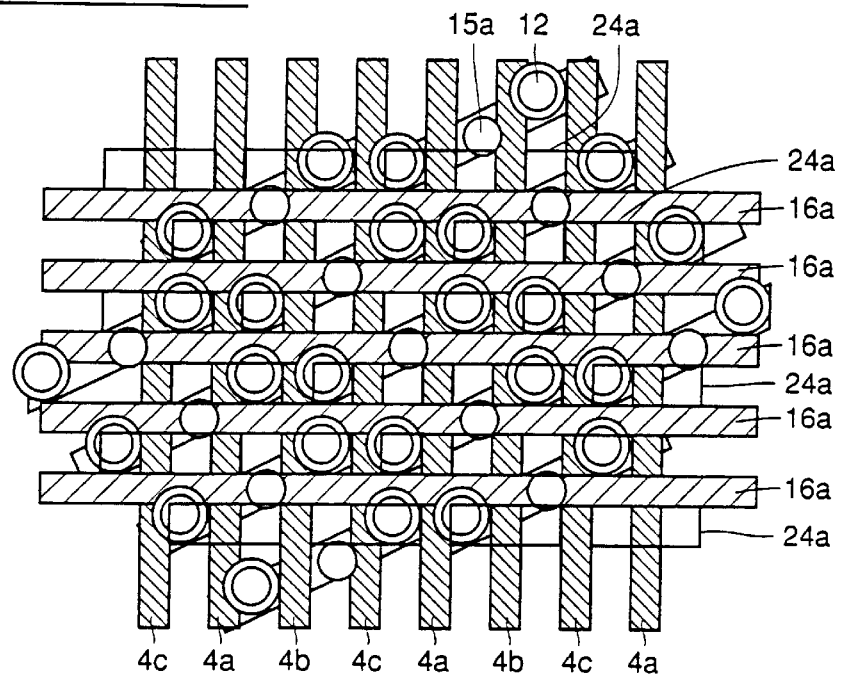
FIG. 2 is a ¼ pitch layout of a memory cell portion of the DRAM shown in FIG. 1.
Figure 3:
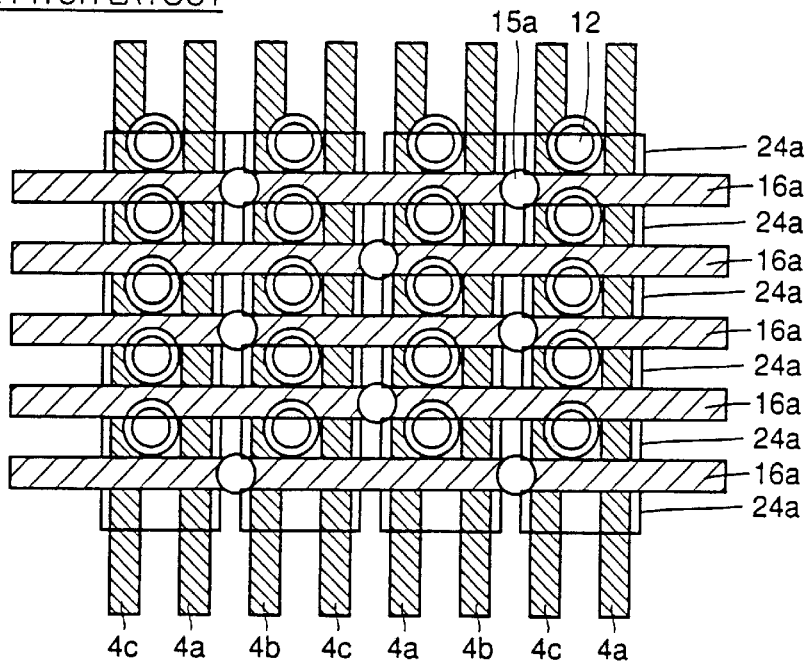
FIG. 3 is a ½ pitch layout of a memory cell portion of the DRAM shown in FIG. 1.

In the structure in accordance with the first embodiment, capacitor lower electrode 24a is formed to cover the side and top surfaces of bit line 16a, with sidewall oxide film 20a and TEOS oxide film 17a located therebetween. FIGS. 2 and 3 show top plan layouts of the entire memory cell portion shown in FIG. 1. FIG. 2 is a ¼ pitch layout while FIG. 3 is a ½ pitch layout. Referring to FIGS. 1 to 3, in the structure of the first embodiment, capacitor lower electrode 24a is located between two adjacent bit lines 16a. Thus, capacitor lower electrode 24a shields the space between adjacent bit lines 16a, and capacitor lower electrode 24a can attain a shield effect. Accordingly, capacitance between adjacent bit lines 16a can be reduced. Since capacitor lower electrode 24a is formed on the top surface of bit line 16a as well, capacitance between adjacent bit lines 16a between their the top surfaces can also be reduced. Since capacitance between bit lines 16a can be reduced, delay in data writing and reading can effectively be prevented.

Referring to FIGS. 4 to 20, a manufacturing process of the DRAM in accordance with the first embodiment will be described below.

Figure 4:
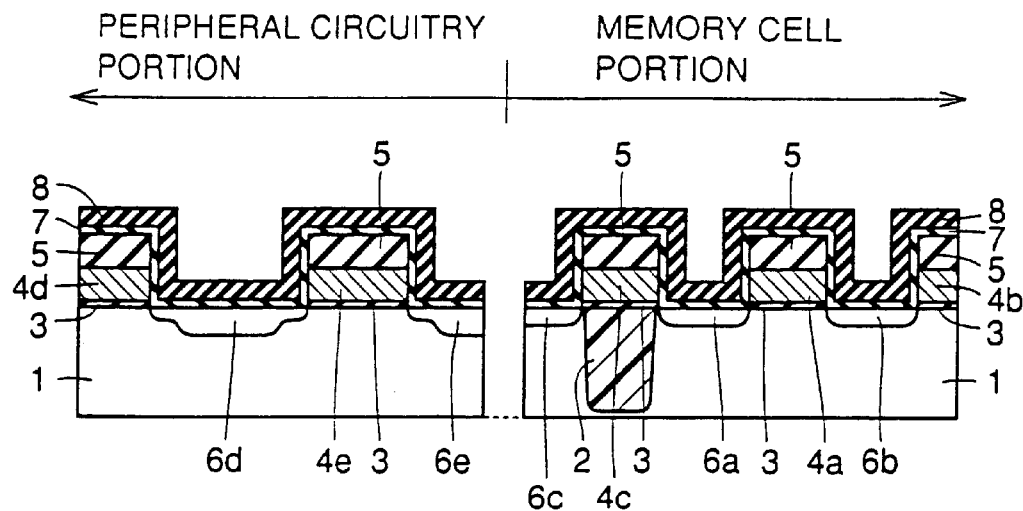
FIGS. 4 to 20 are cross sectional views illustrating a manufacturing process of the DRAM in accordance with the first embodiment shown in FIG. 1.

First, as shown in FIG. 4, isolation region 2 is formed in a prescribed region at the main surface of the memory cell portion of silicon substrate 1. This isolation region 2 may be a trench isolation region formed by filling a trench with an oxide film or an isolation region formed of a LOCOS oxide film. Gate oxide films 3 are formed spaced apart by a prescribed distance on the main surface of silicon substrate 1, and respective gate electrodes 4a to 4e are formed on gate oxide films 3. Gate electrodes 4a to 4e may each have a two-layer structure of a polycrystalline silicon film and a tungsten silicide film formed on the polycrystalline silicon film. Source/drain regions 6a to 6e are formed by using gate electrodes 4a to 4e as a mask and ion-implanting an impurity into silicon substrate 1.

Figure 5:
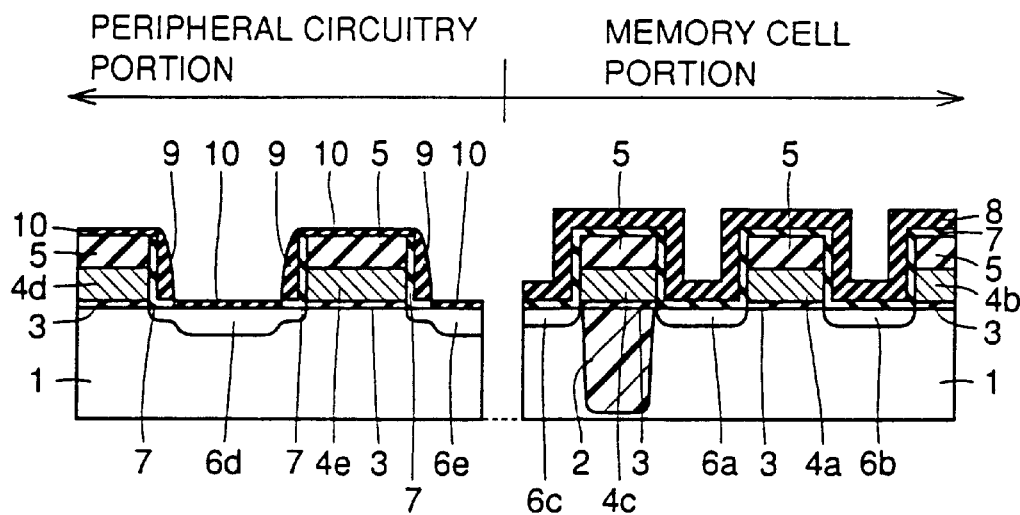

TEOS oxide film 5 is formed on the top surfaces of gate electrodes 4a to 4e. TEOS oxide film 7 having a thickness of approximately 10 nm to approximately 20 nm is formed to cover the entire surface, and thereafter silicon nitride film 8 having a thickness of approximately 30 nm to approximately 50 nm is formed on TEOS oxide film 7. Then, silicon nitride film 8 in the peripheral circuitry portion is subjected to anisotropic etching to form sidewall 9 of a silicon nitride film, as shown in FIG. 5. By ion-implanting an impurity into the surface of silicon substrate 1 in the peripheral circuitry portion while using sidewall 9 as a mask, source/drain regions 6d and 6e each having the LDD structure are formed.

On the top surface of TEOS oxide film 5 in the peripheral circuitry portion, an insulating film of a silicon nitride film is formed to have a film thickness of approximately 5 nm to approximately 10 nm. Here, this insulating film 10 may be formed of a TEOS oxide film.

Figure 6:
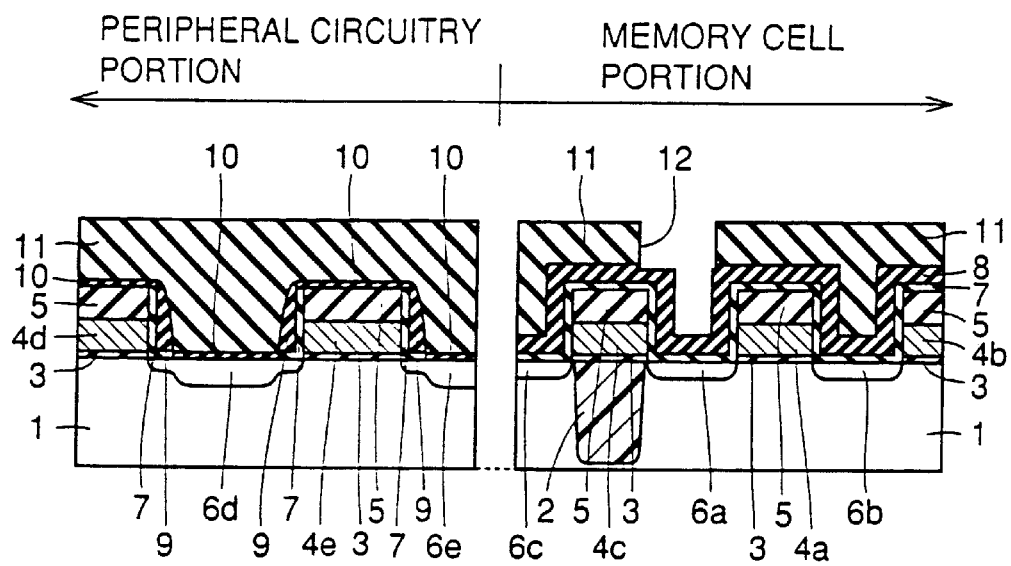
Figure 7:
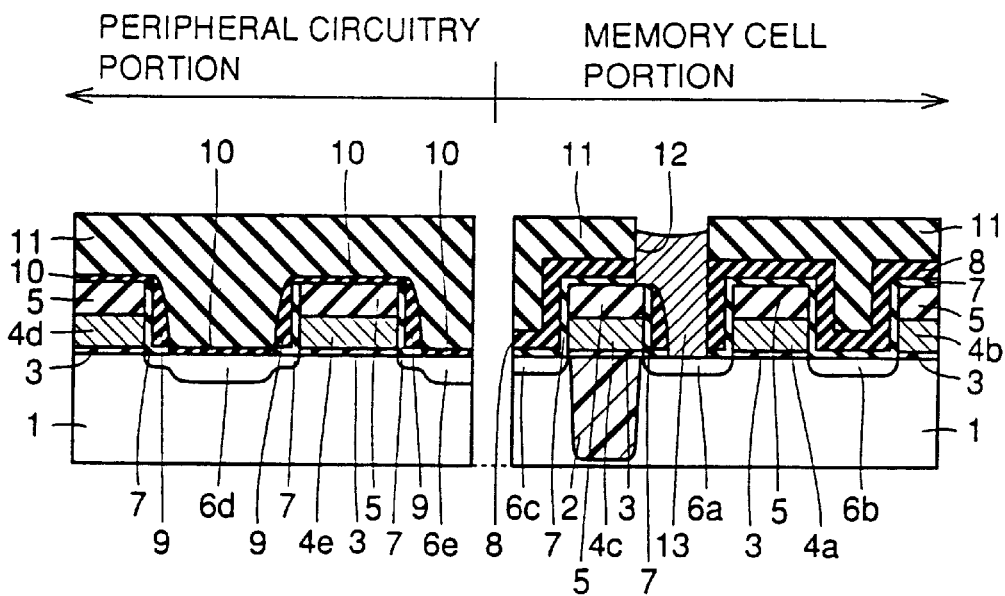

Then, as shown in FIG. 6, interlayer insulating film 11 of a BPSG oxide film or a PSG oxide film is formed, and thereafter capacitor contact hole 12 is formed in the region of interlayer insulating film 11 located over source/drain region 6a. Capacitor contact hole 12 is formed by using silicon nitride film 8 as an etching stopper layer, and an etchant of, for example, $CHF_3/CF_4$, and by etching interlayer insulating film 11 with a selection ratio of at least 10 to 20. Thus, capacitor contact hole 12 is formed in a self-alignment manner. Further, silicon nitride film 8 in capacitor contact hole 12 is subjected to isotropic etching so that it can be selectively etched with respect to interlayer insulating film 11. This isotropic etching is performed with an etchant of, for example, F type gas and the selection ratio of approximately 10. Further, TEOS oxide film 7 on source/drain region 6a is removed by using diluted hydrofluoric acid. For example, HF diluted 50 times is used as the diluted hydrofluoric acid. Thus, capacitor contact hole 12 from the top surface of interlayer insulating film 11 to source/drain region 6a is completed as shown in FIG. 7.

Thereafter, a polycrystalline silicon film (not shown) is formed filling capacitor contact hole 12 and extending along the top surface of interlayer insulating film 11, and the polycrystalline silicon film is subjected to dry etching to form plug electrode 13. This plug electrode 13 is formed to fill capacitor contact hole 12.

Figure 8:
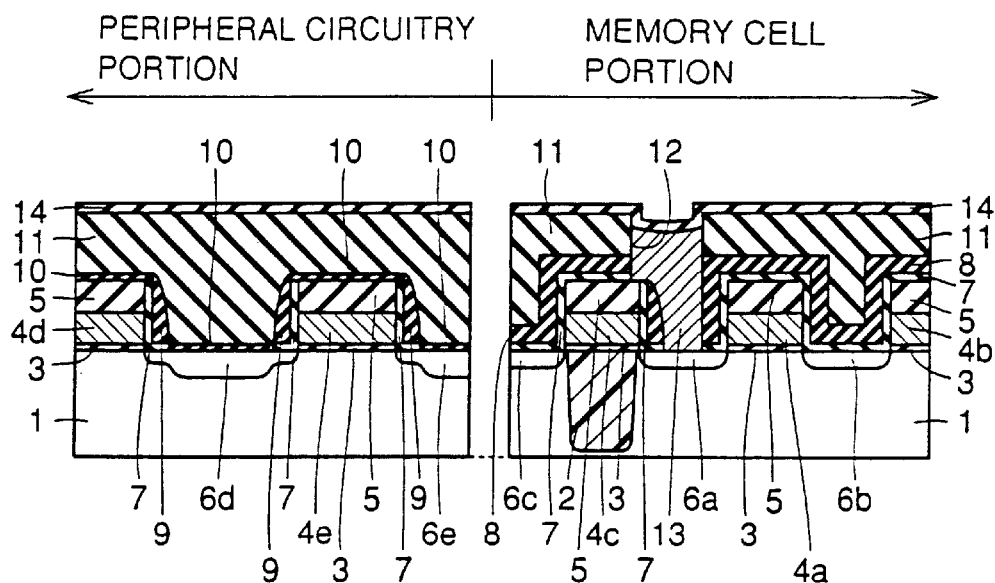

Then, TEOS oxide film 14 having a thickness of approximately 30 nm is formed on the top surfaces of plug electrode 13 and interlayer insulating film 11 as shown in FIG. 8.

Figure 9:
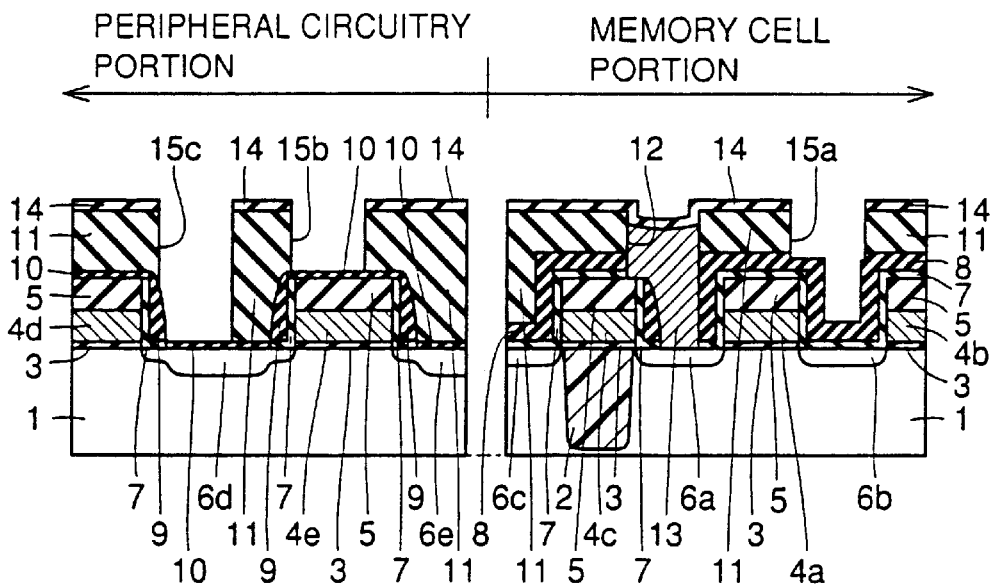

Then, as shown in FIG. 9, interlayer insulating film 11 and TEOS oxide film 14 are etched while using silicon nitride film 8 and insulating film 10 as etching stopper layers, to form bit line contact hole 15a and interconnection contact holes 15b, 15c in a self-alignment manner. Etching of bit line contact 15a by the self-aligned opening method is performed by using an etchant of, for example, $CHF_3/CF_4$ and the selection ratio of at least 10 to 20.

Figure 10:
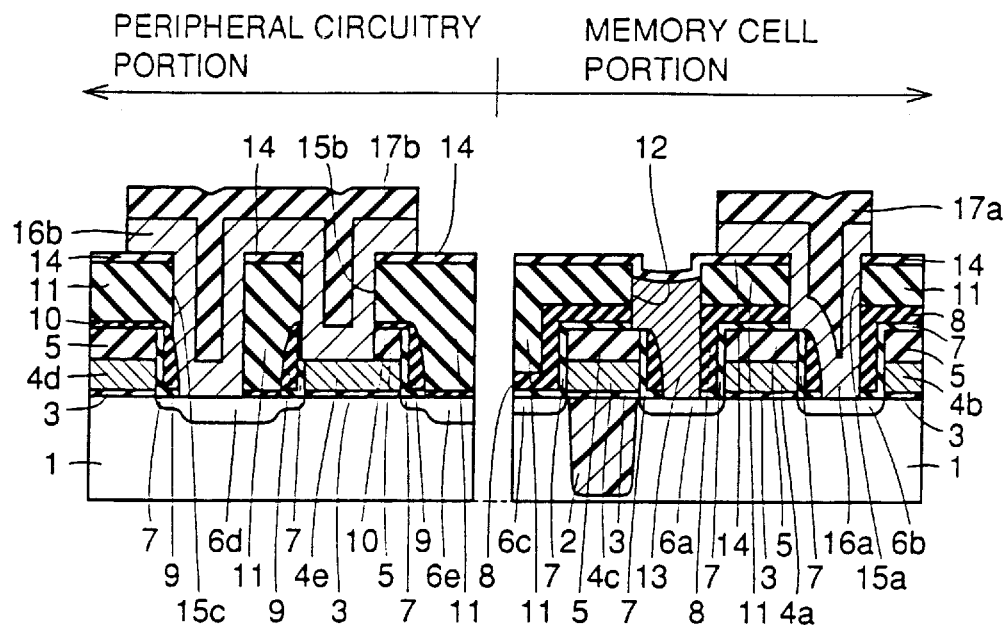

Then, silicon nitride film 8 in bit line contact hole 15a and insulating film 10 in interconnection contact holes 15b and 15c are subjected to anisotropic etching so that silicon nitride film 8 and insulating film 10 can be selectively etched with respect to interlayer insulating film 11. Thus, bit line contact hole 15a and interconnection contact holes 15b, 15c are completed as shown in FIG. 10.

Then, a conductive layer (not shown) which includes a polycrystalline silicon film having a thickness of approximately 50 nm to approximately 100 nm and a titanium silicide film having a thickness of approximately 50 nm to approximately 100 nm, and a TEOS oxide film (not shown) having a thickness of approximately 100 nm to approximately 200 nm on the conductive layer are formed, and the TEOS oxide film and the conductive layer are patterned. Thus, bit line 16a and TEOS oxide film 17a located on the line as well as interconnection layer 16b and TEOS oxide film 17b located on the layer are formed as shown in FIG. 10.

Figure 11:
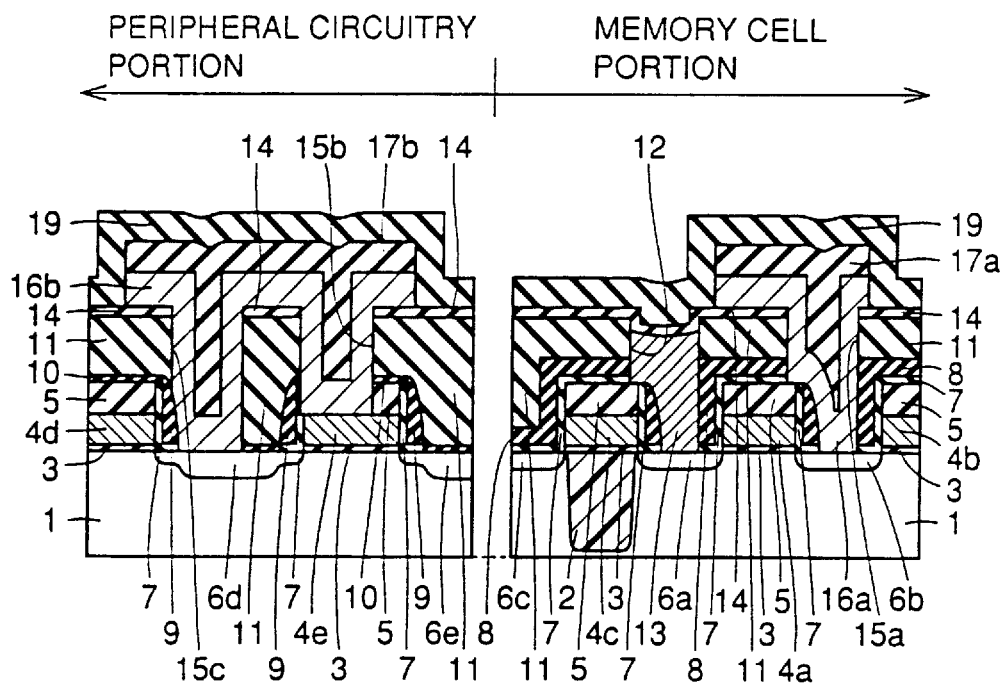
Figure 12:
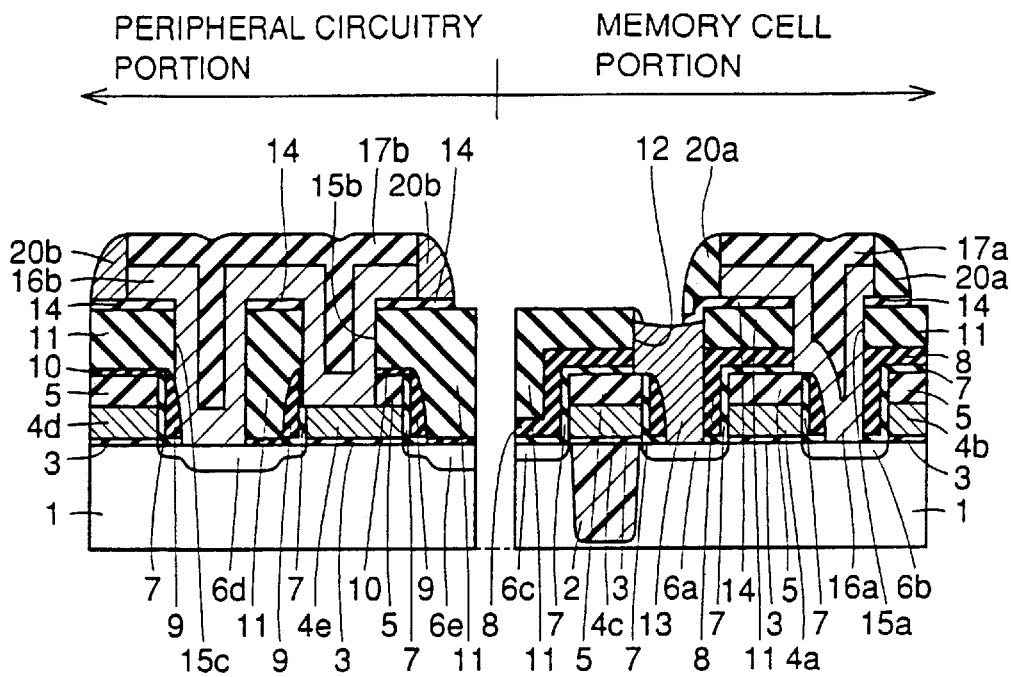

Then, as shown in FIG. 11, a TEOS oxide film 19 is formed to have a thickness of approximately 50 nm to approximately 100 nm and to cover the entire surface, and TEOS oxide film 19 is subjected to dry etching to form sidewall oxide films 20a and 20b each including a TEOS oxide film, as shown in FIG. 12.

Figure 13:
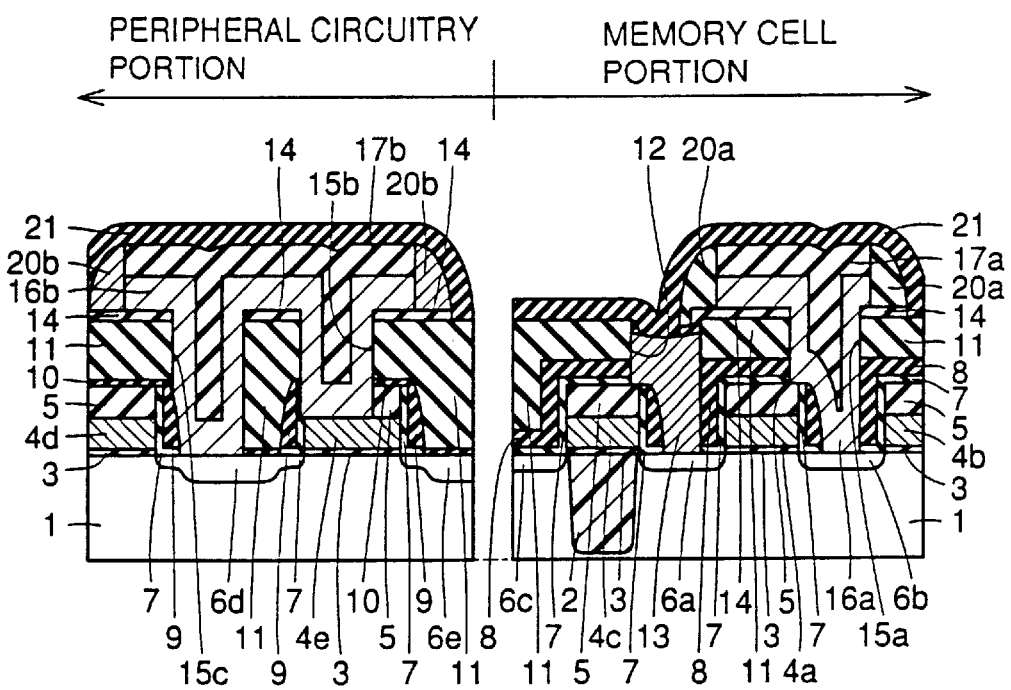
Figure 14:
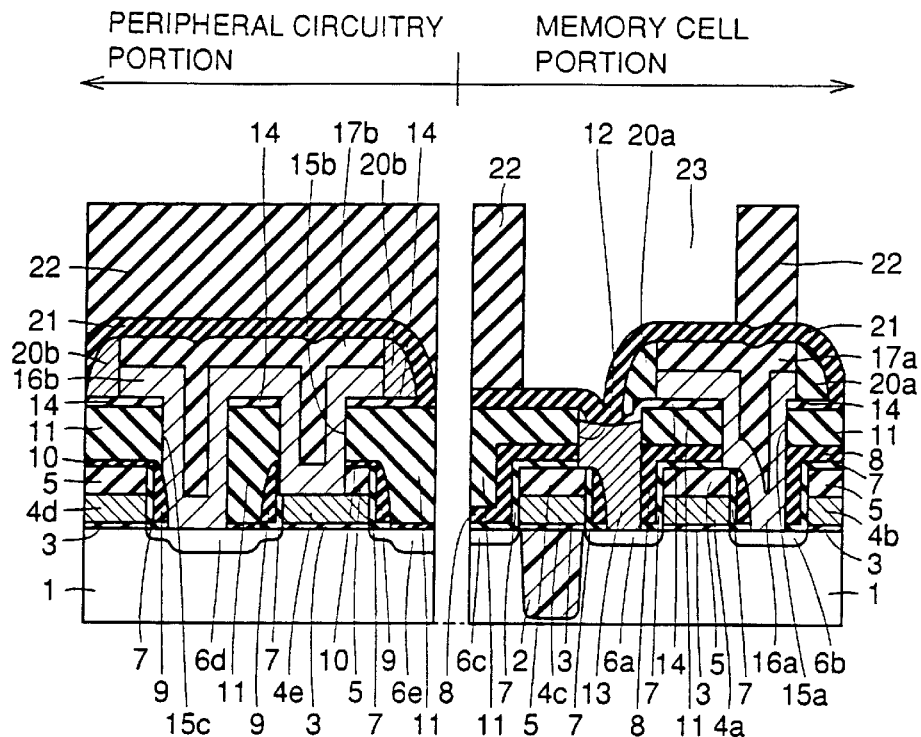

Thereafter, silicon nitride film 21 is formed to have a thickness of approximately 50 nm as shown in FIG. 13. Then, as shown in FIG. 14, an insulating film 22 of a BPSG oxide film or a TEOS oxide film is formed on silicon nitride film 21, and a capacitor hole 23 is formed by the self aligned contact opening method using silicon nitride film 21 as an etching stopper layer. Capacitor hole 23 is formed by etching with an etchant of $CHF_3/CF_4$ and the selection ratio of at least 10 to 20.

Figure 15:
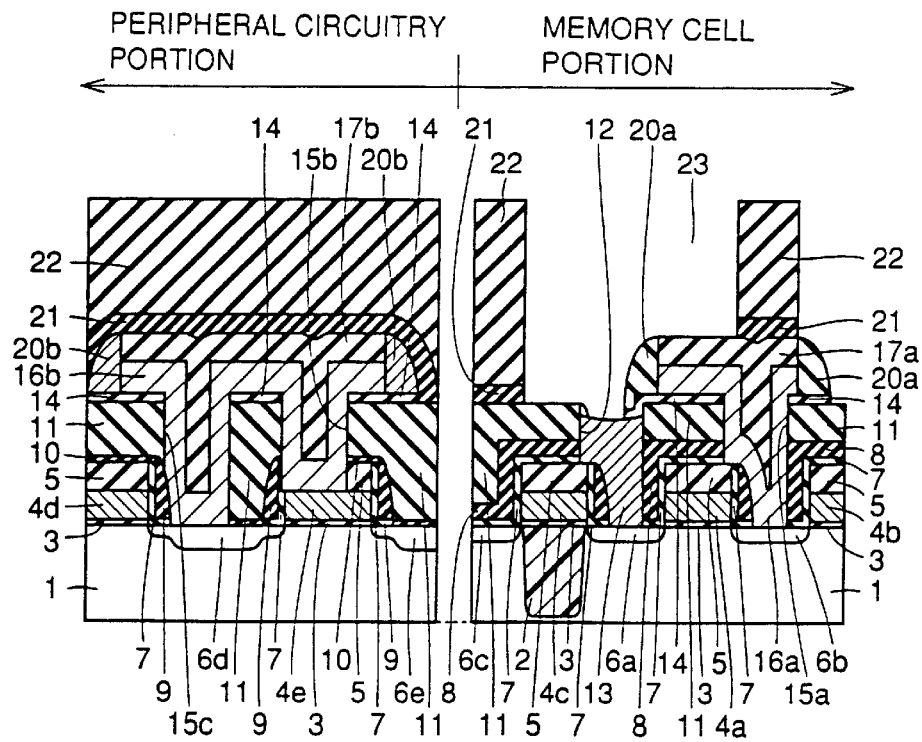

Silicon nitride film 21 in capacitor hole 23 is removed by isotropic etching which allows selective etching with respect to insulating film 22. This isotropic etching is performed by using hot phosphoric acid, for example, and the selection ratio of approximately 50. Thus, the structure shown in FIG. 15 is obtained. Then, the top surface of plug electrode 13 is cleaned with diluted hydrofluoric acid such as HF diluted 100 times.

Figure 16:
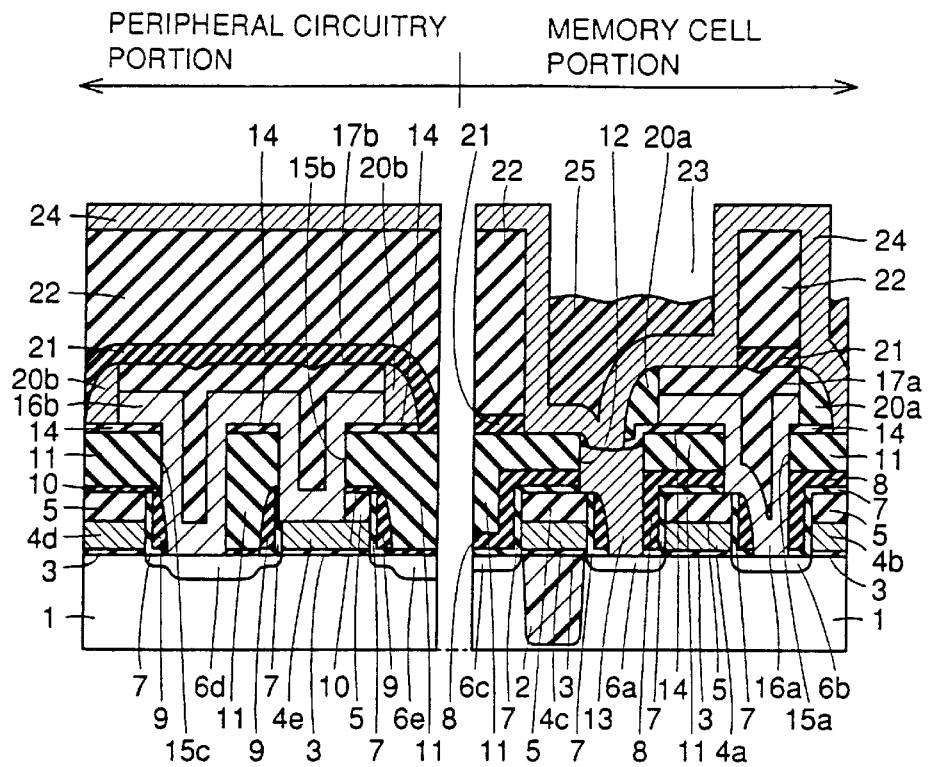
Figure 17:
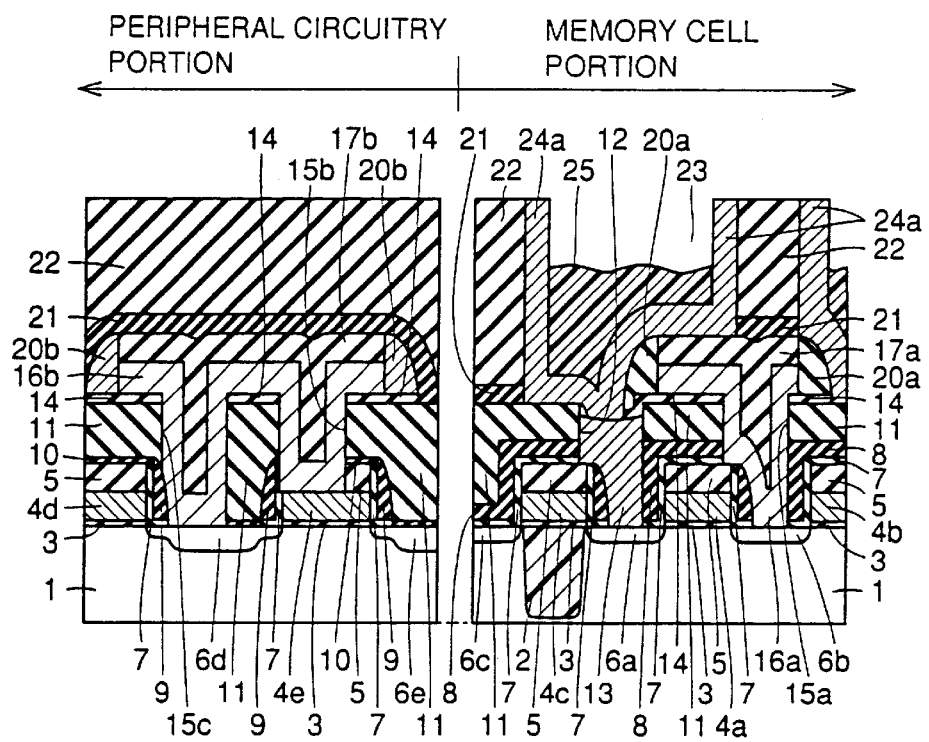
Figure 18:
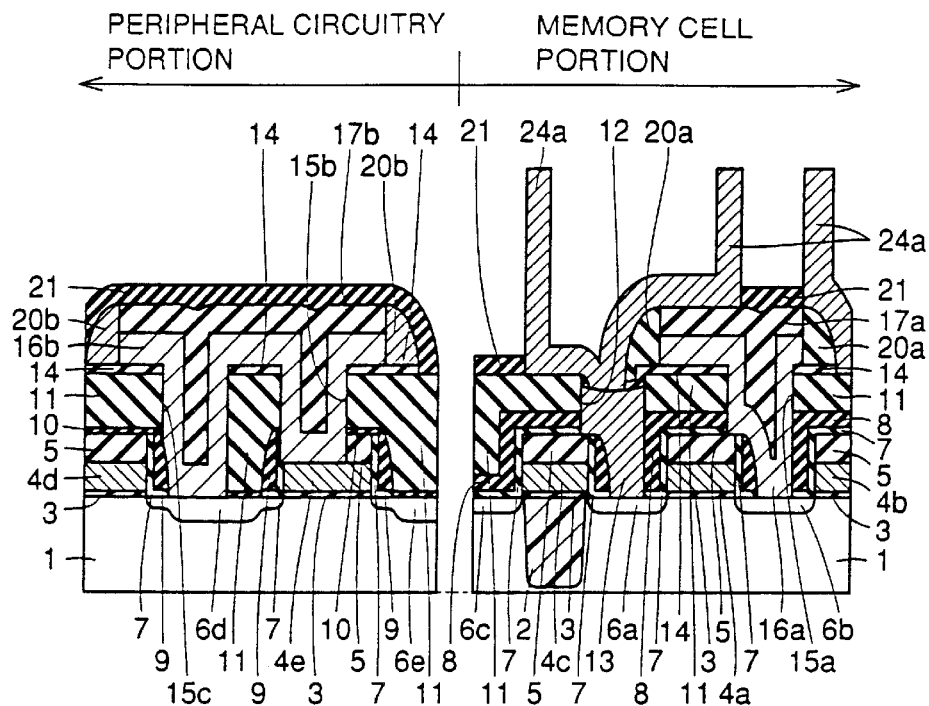
Figure 19:
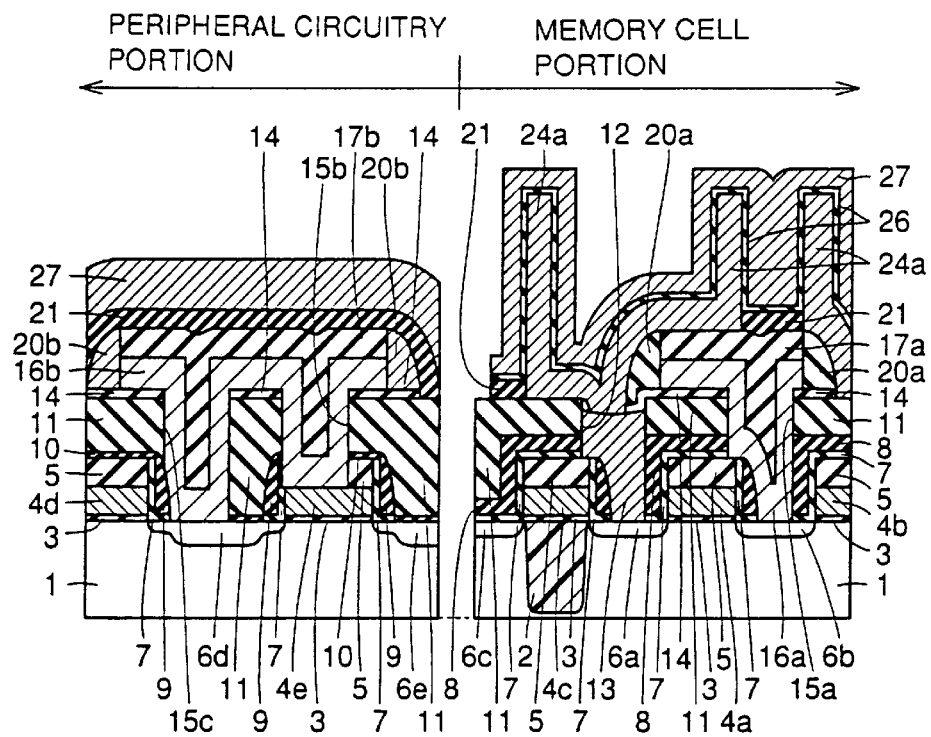
Figure 20:
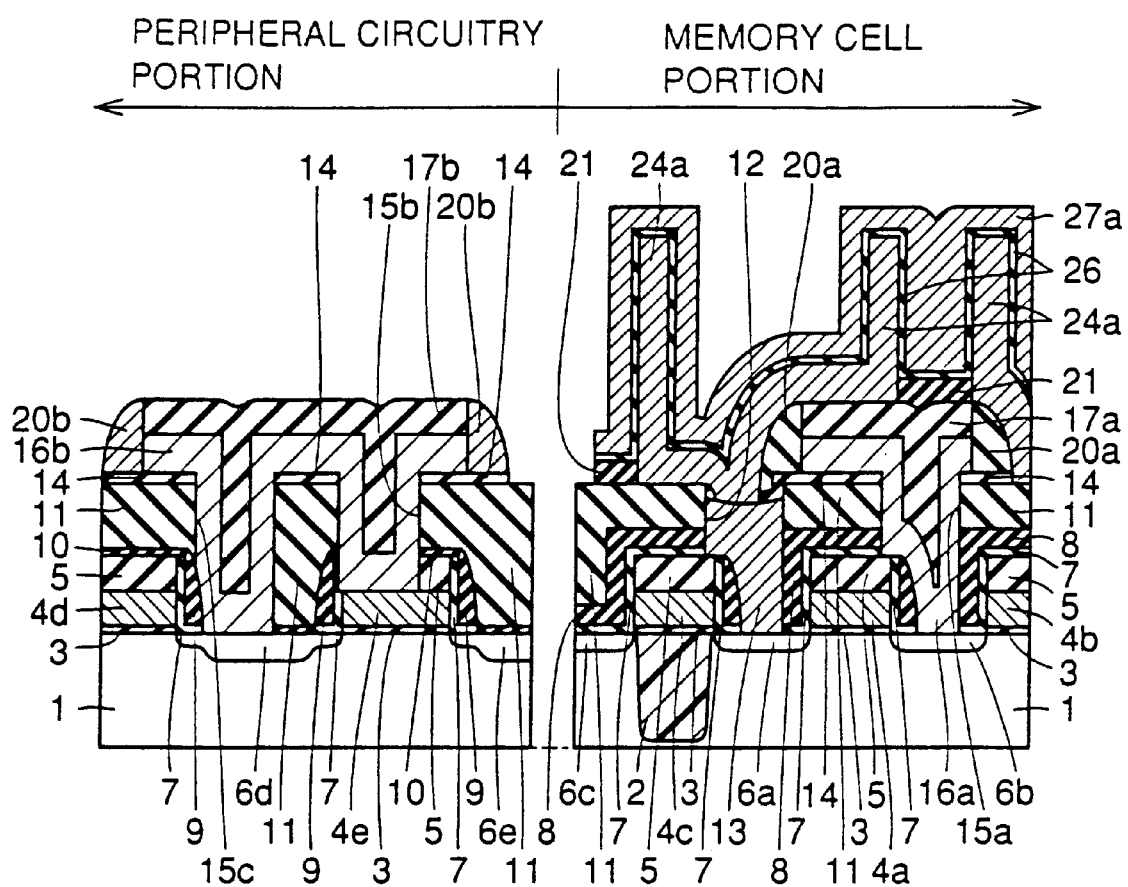

Then, as shown in FIG. 16, a polycrystalline silicon film 24 is formed to have a film thickness of approximately 100 nm, and a photoresist 25 is filled in capacitor hole 23. Polycrystalline silicon film 24 on interlayer insulating film 22 is removed by dry etching to obtain cylindrically shaped lower electrode 24a shown in FIG. 17. When interlayer insulating film 22 is removed by isotropic etching, the structure shown in FIG. 18 is obtained. Interlayer insulating film 22 is etched, for example, with HF diluted 10 times.

Then, capacitor dielectric film 26 and a polycrystalline silicon film 27 are formed to cover the entire surface. For example, a silicon oxide nitride film, or a high dielectric film such as a $Ta_2O_5$ film may be used as capacitor dielectric film 26. Patterning the structure shown in FIG. 19 results in capacitor upper electrode 27a of a polycrystalline silicon film shown in FIG. 20.

After interlayer insulating film 28 including, for example, a TEOS oxide film or a BPSG oxide film is formed on the entire surface as shown in FIG. 1, metal interconnections 30 are formed spaced apart by a prescribed distance on the top surface of interlayer insulating film 28 in the memory cell portion. A contact hole is formed in interlayer insulating film 28 and TEOS oxide film 17b in the peripheral circuitry portion, and thereafter metal interconnection layer 29 is formed electrically connected to interconnection layer 16b in that contact hole and extending along the top surface of interlayer insulating film 28. Thus, the DRAM in accordance with the first embodiment shown in FIG. 1 is completed.

Second Embodiment

Figure 21:
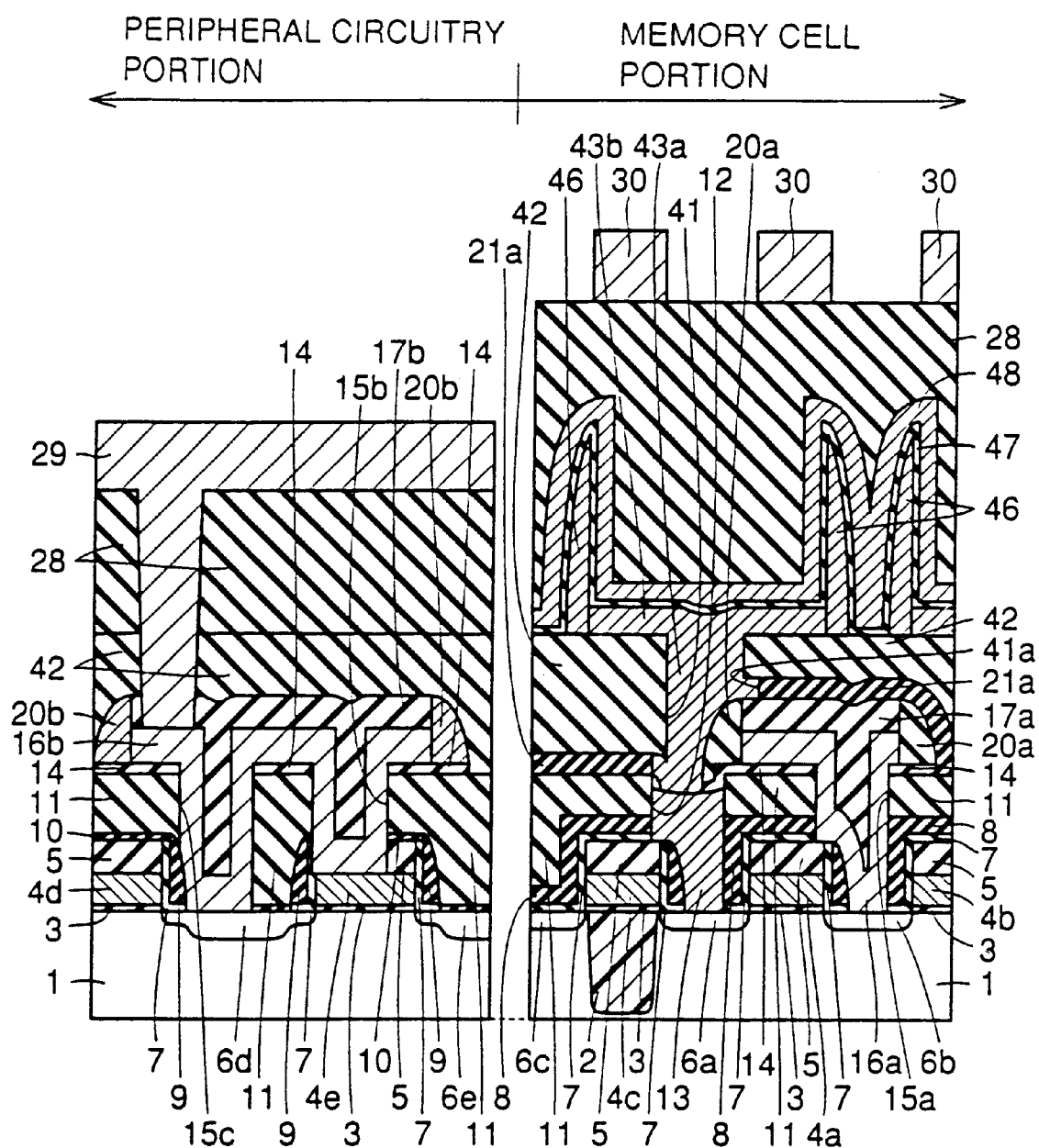
FIG. 21 is a cross sectional view showing a DRAM in accordance with a second embodiment of the present invention.
Figure 22:
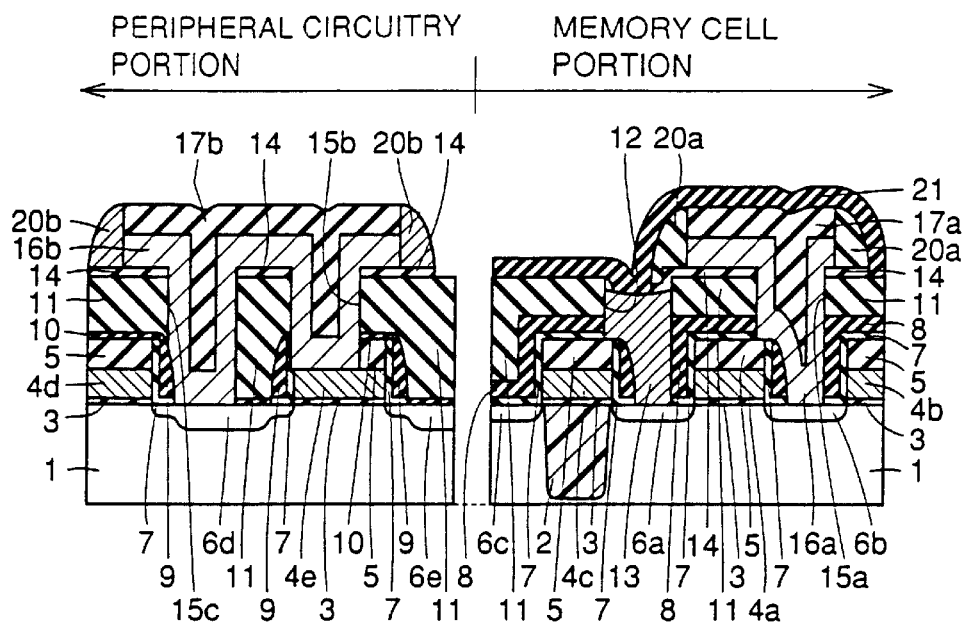
FIGS. 22 to 30 are cross sectional views illustrating a manufacturing process of the DRAM in accordance with the second embodiment shown in FIG. 21.

Referring to FIG. 21, in a DRAM in accordance with a second embodiment, plug electrode 13 and bit line 16a are of the same structures as in the first embodiment. However, a capacitor has a different structure in the second embodiment.

Specifically, in the structure of the second embodiment, a capacitor lower electrode portion 43b is not directly connected to the top surface of plug electrode 13, but a capacitor contact portion 43a is placed between capacitor lower electrode portion 43b and plug electrode 13. Capacitor contact portion 43a is formed integrally with capacitor lower electrode 43b.

A silicon nitride film 21a is formed on the top surfaces of interlayer insulating film 11 and TEOS oxide film 17a. An interlayer insulating film 42 of a multilayer film including a TEOS oxide film, and a BPSG oxide film or a PSG oxide film is formed on silicon nitride film 21a. Interlayer insulating film 42, silicon nitride film 21a, sidewall oxide film 20a and TEOS oxide film 14 form a second capacitor contact hole 41. A concave portion 41a is formed in the region of second capacitor contact hole 41 located over a side end of bit line 16a. Capacitor contact portion 43a is formed to fill second capacitor contact hole 41 and concave portion 41a.

Capacitor lower electrode portion 43b extending along the top surface of interlayer insulating film 42 is formed integrally with the top of capacitor contact portion 43a. A sidewall 46 of a polycrystalline silicon film extending upward is formed to come into contact with both side ends of capacitor lower electrode portion 43b. Capacitor lower electrode portion 43b and sidewall 46 constitute the capacitor lower electrode. A capacitor dielectric film 46 is formed to cover capacitor lower electrode portion 43b and sidewall 46, and a capacitor upper electrode 48 of a polycrystalline silicon film is formed to cover capacitor dielectric film 46.

In the peripheral circuitry portion, interlayer insulating film 42 is formed to cover TEOS oxide film 17b and sidewall oxide film 20b, and interlayer insulating film 28 is formed on interlayer insulating film 42. A contact hole is provided in a prescribed region of interlayer insulating films 28, 42 and TEOS oxide film 17b, and metal interconnection 29 is formed to be electrically connected to interconnection layer 16b through the contact hole.

In the second embodiment, first capacitor contact hole 12 can be formed at the same aspect ratio as bit line contact hole 15a as described in the first embodiment above, so that the self aligned contact opening method using silicon nitride film 8 can be used for forming first capacitor contact hole 12. Further, by separating the capacitor contact hole into two stages of first capacitor contact hole 12 and second capacitor contact hole 41 located thereon, the aspect ratio of second capacitor contact hole 41 can be reduced. Thus, second capacitor contact hole 41 can also be formed by the self aligned opening method using silicon nitride film 21a as an etching stopper layer.

In the second embodiment, since both of first capacitor contact hole 12 and second capacitor contact hole 41 can be formed by the self aligned opening method respectively using silicon nitride films 8 and 21a, the manufacturing method can be made simpler as compared with the case where a capacitor contact hole is formed by the conventional diameter reduction process. Even if a memory cell is smaller, first capacitor contact hole 12 and second capacitor contact hole 41 can easily be formed.

In the structure of the second embodiment, since capacitor contact portion 43a is formed to cover the side and top surfaces of bit line 16a with sidewall oxide film 20a and TEOS oxide film 17a located therebetween, capacitance between adjacent bit lines 16a can be reduced. Therefore, delay in reading and writing of data from and to a memory cell can be prevented, and access speed can be improved.

In the structure of the second embodiment, the area of the top surface of plug electrode 13 connected to capacitor lower electrode 24a is larger than the area of the bottom surface of plug electrode 13 connected to source/drain region 6a as in the first embodiment above. Therefore, a sufficient displacement margin is ensured for forming capacitor lower electrode 24a to be connected to the top surface of plug electrode 13. As a result, the process of forming capacitor lower electrode 24a becomes easier.

A manufacturing process in accordance with the second embodiment will be described below with respect to FIGS. 22 to 30.

First, the same process as the manufacturing process in accordance with the first embodiment shown in FIGS. 4 to 13 is performed until silicon nitride film 21 is formed. Then, silicon nitride film 21 in the peripheral circuitry portion is removed to obtain the shape shown in FIG. 22.

Figure 23:
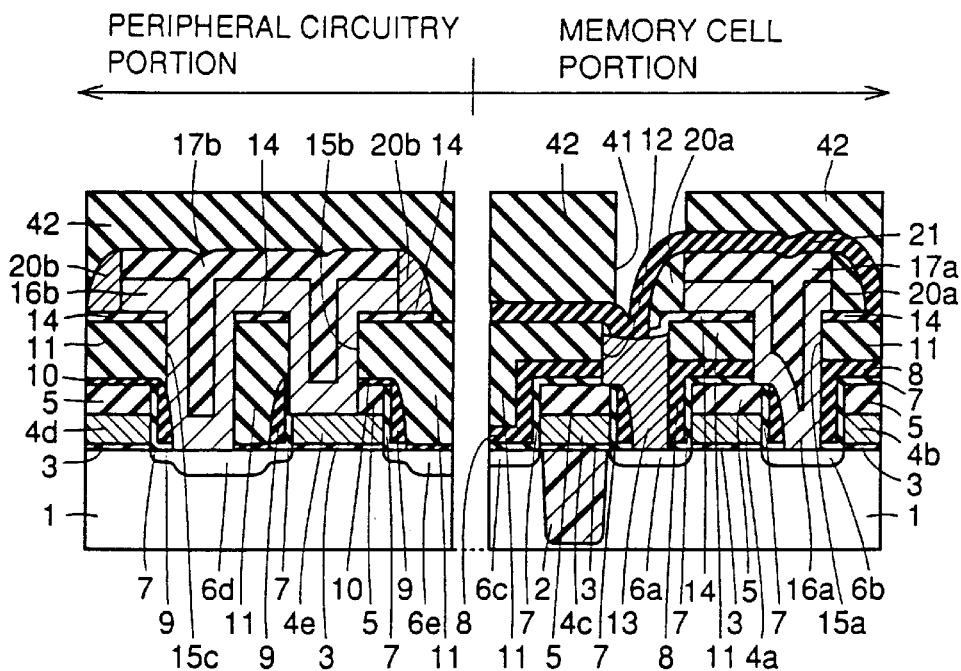

Then, interlayer insulating film 42 of a multilayer film including either one of a BPSG oxide film or a PSG oxide film and a TEOS oxide film thereon is formed as shown in FIG. 23. The TEOS oxide film in this case is formed to have a thickness of approximately 10 nm to approximately 20 nm. Thereafter, the region of interlayer insulating film 42 located over plug electrode 13 is etched by using silicon nitride film 21 as an etching stopper layer. Etching in this case uses an etchant of $CHF_3/CF_4$ and the selection ratio of at least 10 to 20. Thus, capacitor contact hole 41 is formed in a self-alignment manner.

Figure 24:
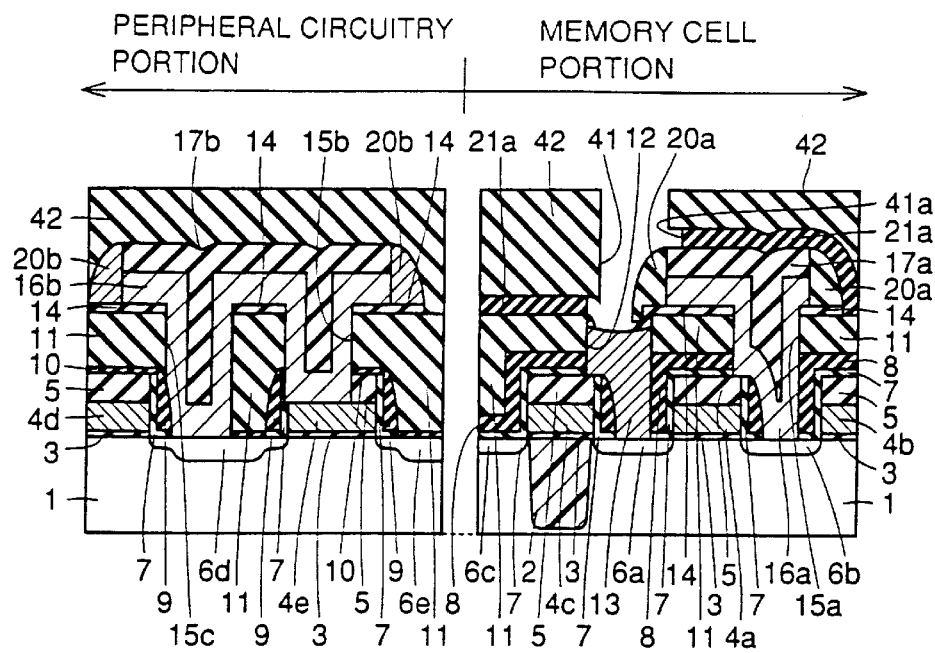

Then, silicon nitride film 21 is subjected to isotropic etching allowing selective etching of silicon nitride film 21 with respect to interlayer insulating film 42. This isotropic etching is carried out by using hot phosphoric acid, for example, and the selection ratio of approximately 50. Silicon nitride film 21a formed by such an isotropic etching has a shape which is considerably receded with respect to interlayer insulating film 42, as shown in FIG. 24. In short, concave portion 41a is formed over a side end of bit line 16a. Then, the top surface of plug electrode 13 is cleaned with diluted hydrofluoric acid, for example. For example, HF diluted 100 times is used for cleaning.

Figure 25:
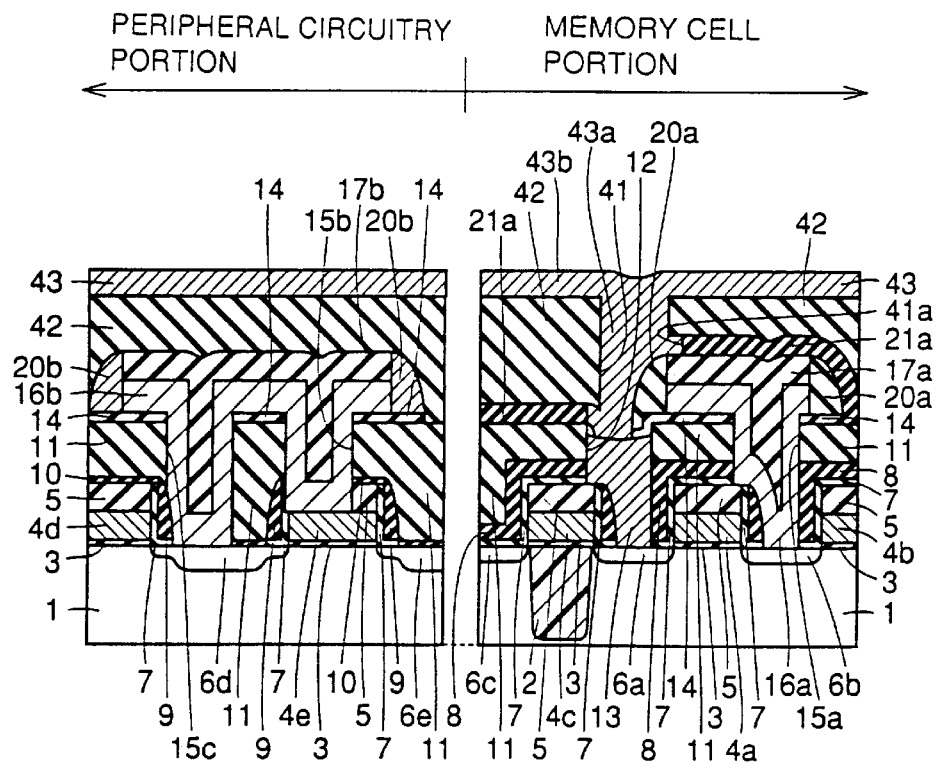
Figure 26:
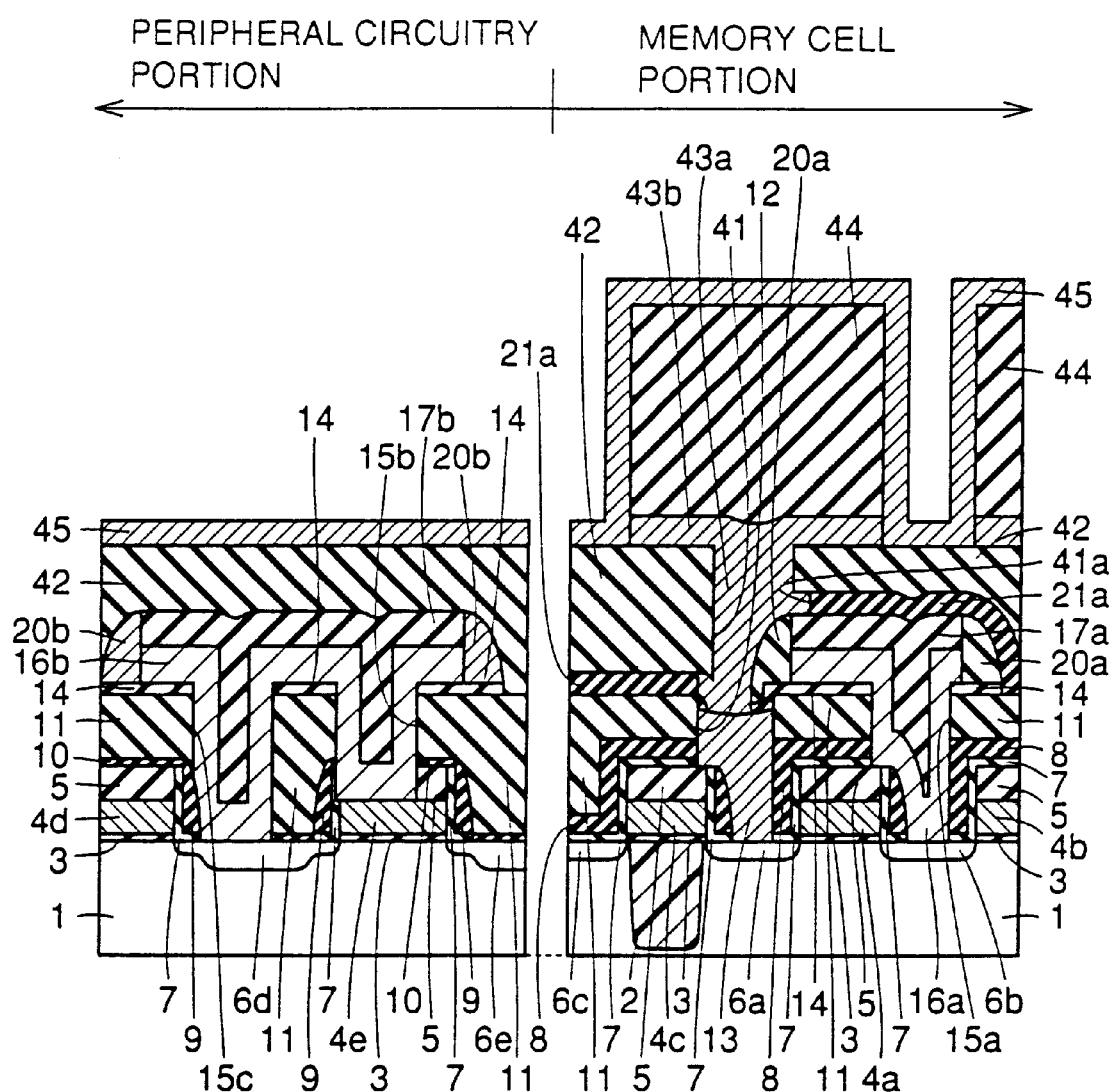

Thereafter, a polycrystalline silicon film 43 is formed as shown in FIG. 25. Polycrystalline silicon film 43 is formed to fill second capacitor contact hole 41 and its concave portion 41a and to extend on the top surface of interlayer insulating film 42. Next, a BPSG oxide film (not shown) having a thickness of approximately 50 nm to approximately 100 nm is formed on polycrystalline silicon film 43, and the BPSG oxide film and polycrystalline silicon film 43 are patterned to obtain capacitor contact portion 43a, capacitor lower electrode portion 43b, and a BPSG oxide film 44 located on capacitor lower electrode portion 43b, as shown in FIG. 26.

Figure 27:
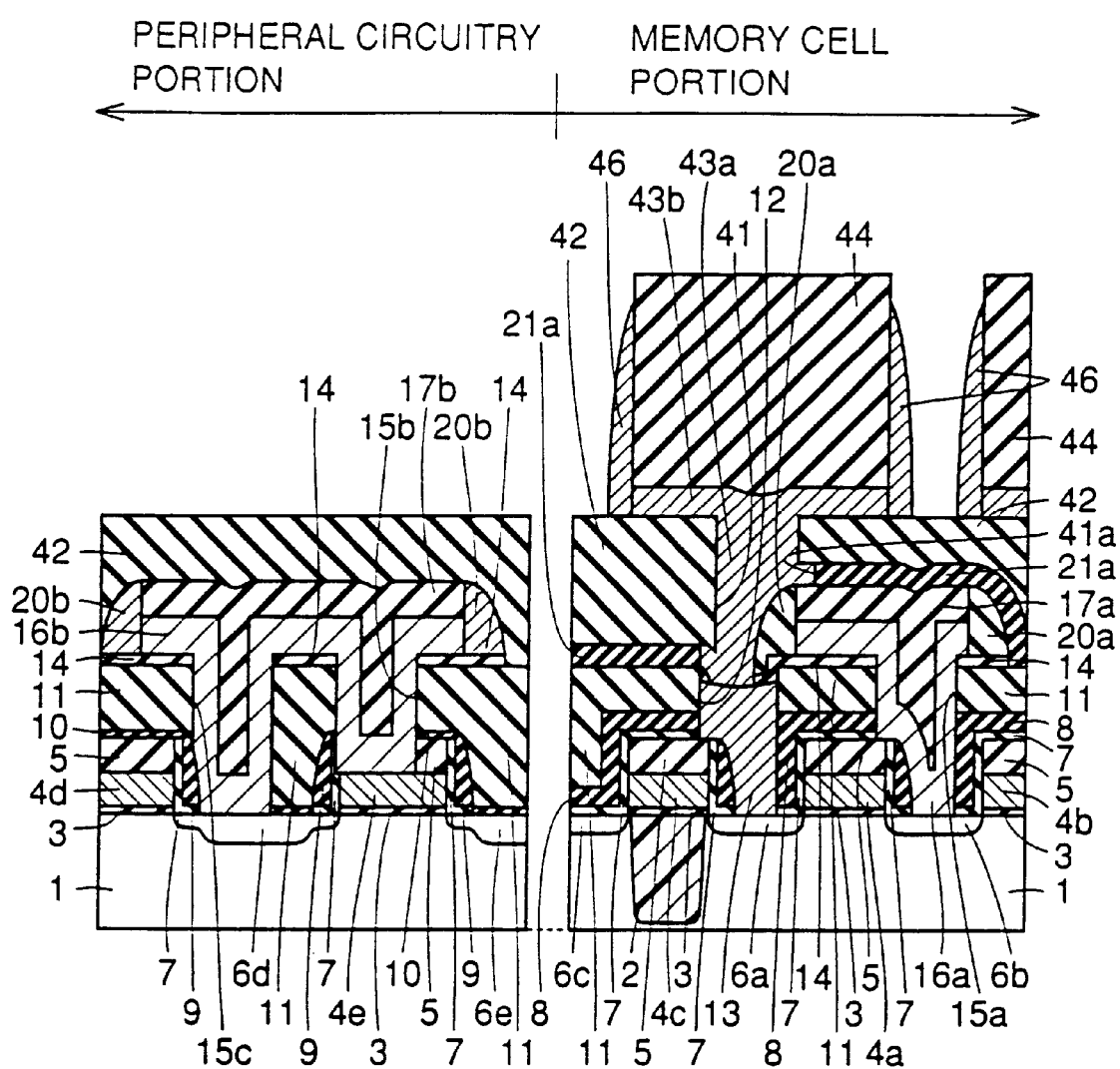
Figure 28:
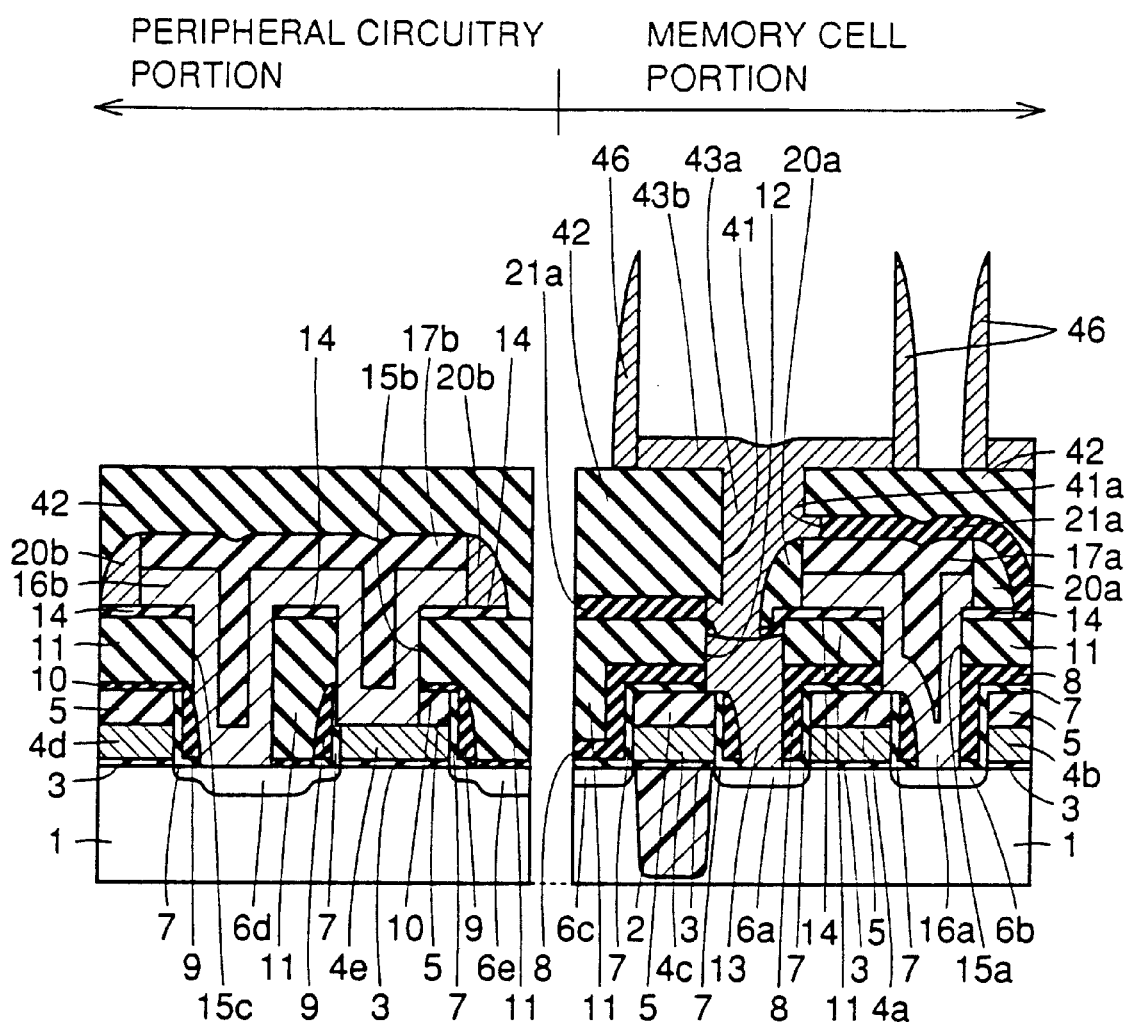

Then, a polycrystalline silicon film 45 having a thickness of approximately 50 nm to approximately 100 nm is formed to cover interlayer insulating film 42 and BPSG oxide film 44. Polycrystalline silicon film 45 is subjected to anisotropic etching to form sidewall 46 of a polycrystalline silicon film, serving as the capacitor lower electrode, as shown in FIG. 27. Sidewall 46 and capacitor lower electrode portion 43b constitute a cylindrical capacitor lower electrode. Then, BPSG oxide film 44 is subjected to etching of a high selection ratio (selection ratio of approximately 1000) with respect to interlayer insulating film 42 and capacitor lower electrode (46, 43b) by using gas phase HF. Thus, BPSG oxide film 44 is removed and the structure shown in FIG. 28 is obtained.

Figure 29:
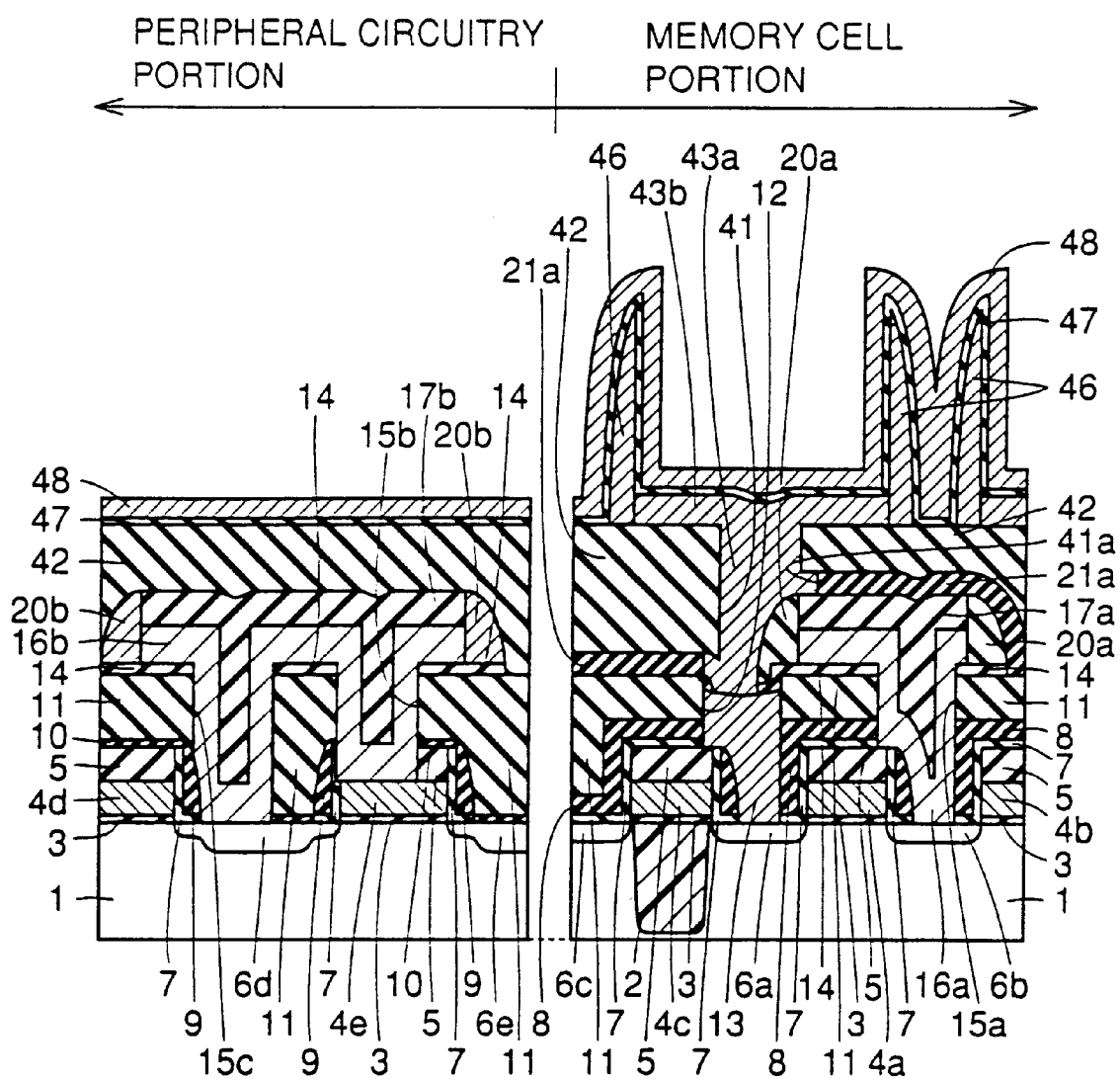
Figure 30:
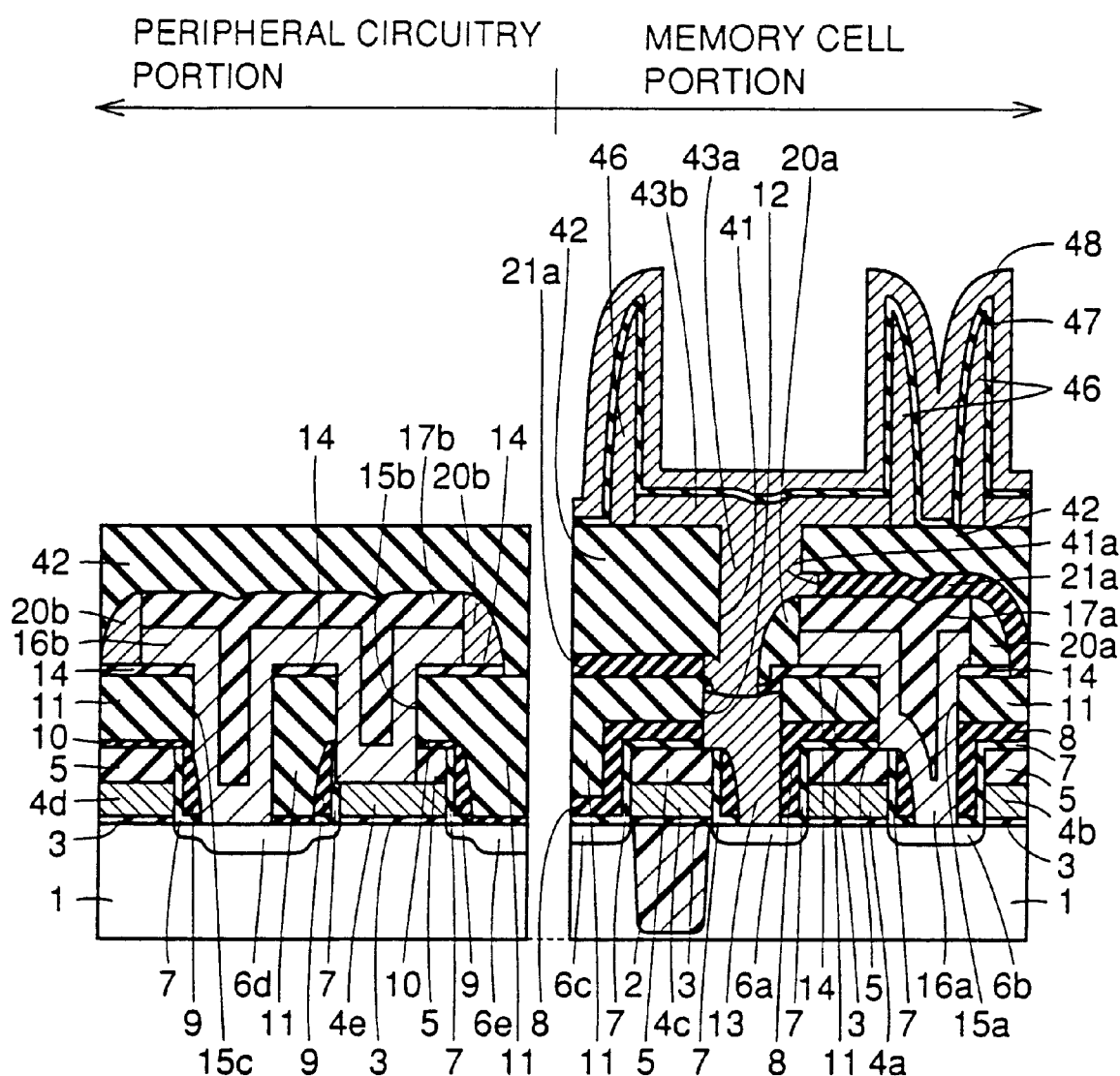

Then, capacitor dielectric film 47 is formed to cover capacitor lower electrode portion 43b and sidewall 46 as shown in FIG. 29, and thereafter capacitor upper electrode 48 of a polycrystal silicon film is formed to cover capacitor dielectric film 47. A dielectric film such as a silicon oxide nitride film or a high dielectric film such as a $Ta_2O_5$ film is used as the capacitor dielectric film. Then, by patterning capacitor upper electrode 48 and capacitor dielectric film 47, capacitor upper electrode 48 is obtained having the shape shown in FIG. 30.

Then, interlayer insulating film 28 is formed to cover capacitor upper electrode 48 as shown in FIG. 21, and thereafter metal interconnections 30 are formed spaced apart by a prescribed distance on the top surface of interlayer insulating film 28 in the memory cell portion. After forming a contact hole in interlayer insulating films 28, 42 and TEOS oxide film 17b in the peripheral circuitry portion, metal interconnection 29 is formed to be electrically connected to interconnection layer 16b through the contact hole. Thus, the DRAM in accordance with the second embodiment is formed.

Third Embodiment

Figure 31:
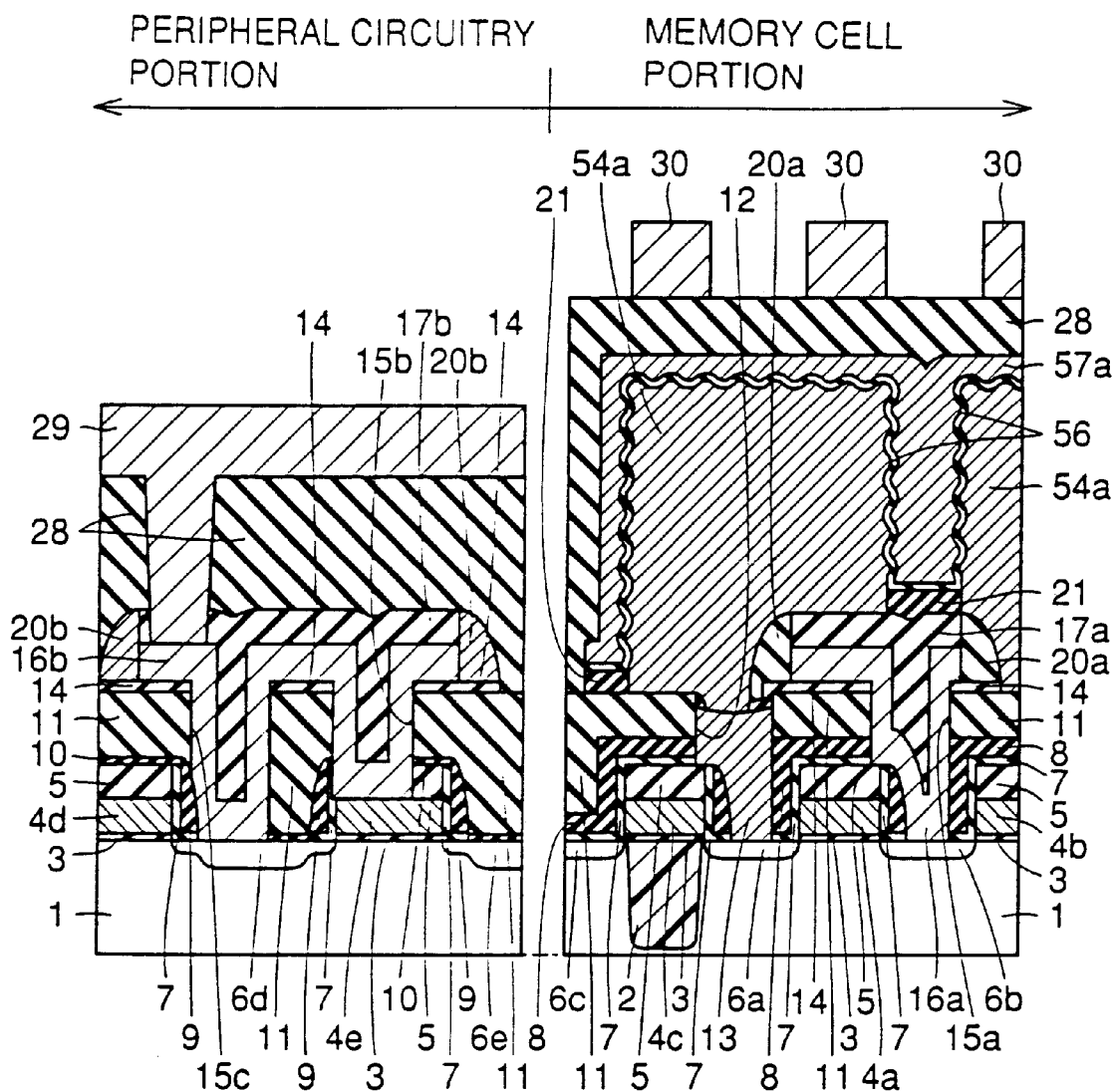
FIG. 31 is a cross sectional view showing a DRAM in accordance with a third embodiment of the present invention.

Referring to FIG. 31, in a third embodiment, a capacitor lower electrode 54a has a simple stacked type structure instead of the cylindrical structure of the above described first embodiments. Further, capacitor lower electrode 54a has a surface which is roughened to have irregularity. Thus, the surface area of capacitor lower electrode 54a is increased, allowing increase in capacitor capacitance. Here, a capacitor upper electrode 57a is formed on capacitor lower electrode 54a with a capacitor dielectric film 56 therebetween.

Capacitor lower electrode 54a having irregularity on its surface is formed as described below. In short, polycrystalline silicon particles are selectively grown on a polycrystalline silicon film by introducing disilane ($Si_2H_6$) or silane ($SiH_4$) gas into the atmosphere of high vacuum (~$10^{-6}$Torr). Thus, capacitor lower electrode 54a having an irregular shape as shown in FIG. 31 can be formed.

In the structure in accordance with the third embodiment as well, capacitor lower electrode 54a is electrically connected to source/drain region 6a through plug electrode 13 as in the first embodiment above. Therefore, capacitor contact hole 12 can be formed at the same aspect ratio as bit line contact hole 15a as described in the first embodiment. As a result, capacitor contact hole 12 can be formed by the self aligned opening method using silicon nitride film 8 as an etching stopper layer. Accordingly, the manufacturing process can be made simpler as compared with the case where a capacitor contact hole is formed by the diameter reduction process. Since capacitor lower electrode 54a covers side and the top of bit line 16a with sidewall oxide film 20a and TEOS oxide film 17a located therebetween, capacitance between adjacent bit lines 16a can be reduced. As a result, operation speed can be prevented from becoming slower.

Fourth Embodiment

Figure 32:
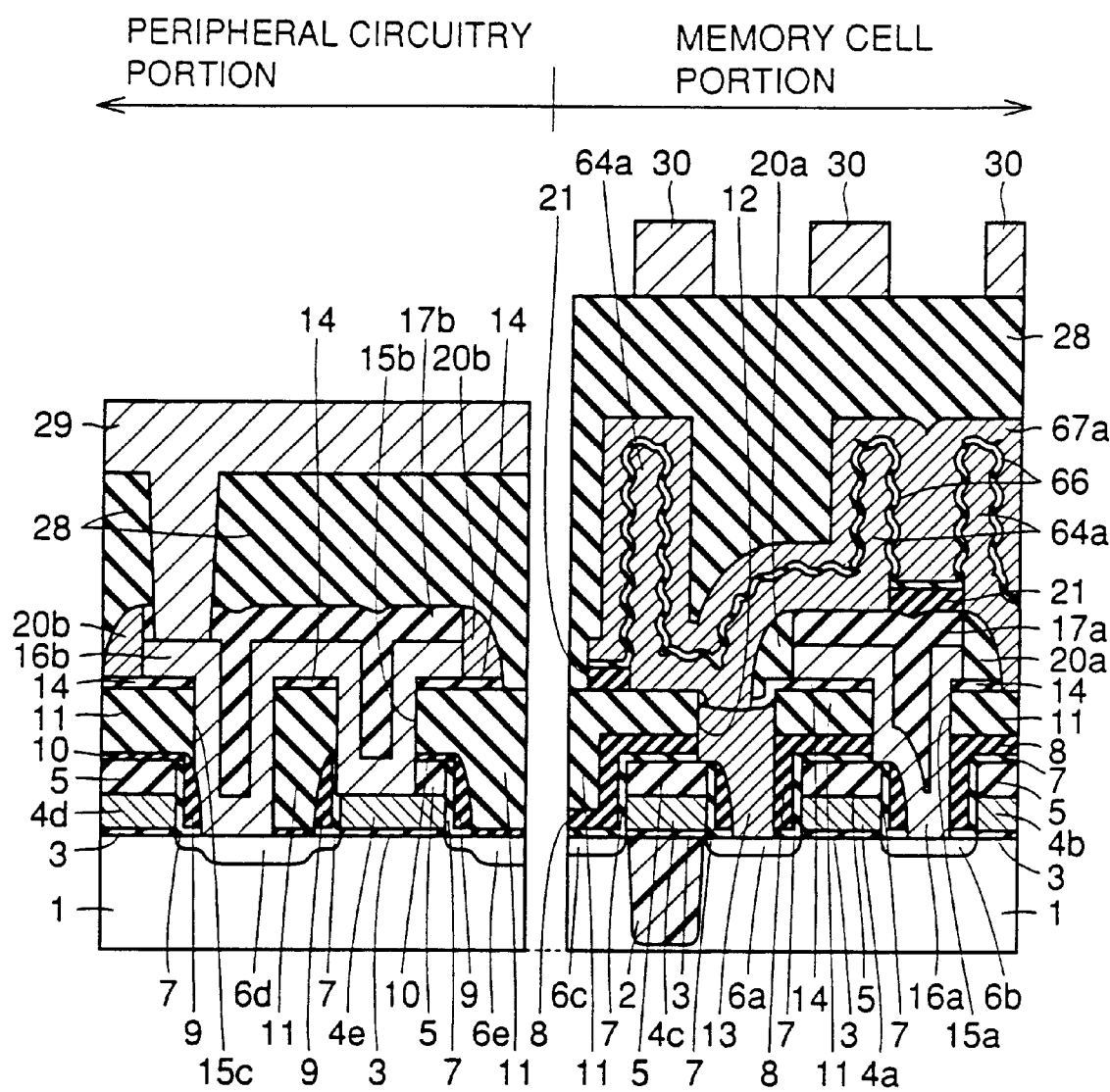
FIG. 32 is a cross sectional view showing a DRAM in accordance with a fourth embodiment of the present invention.

Referring to FIG. 32, a fourth embodiment has basically the same structure as the first embodiment shown in FIG. 1. The fourth embodiment is different from the first embodiment in that a capacitor lower electrode 64a has an irregular shape on its surface in the fourth embodiment. A capacitor upper electrode 67a is formed to cover capacitor upper electrode 64a having the irregular shape with a capacitor dielectric film 66 located therebetween. By roughening the surface of capacitor lower electrode 64a to have the irregular shape, capacitor capacitance can be increased. A method of roughening the surface of capacitor lower electrode 64a is the same as in the third embodiment above.

Since the structure in accordance with the fourth embodiment has basically the same structure as the first embodiment, the process of forming a capacitor contact hole can be made simpler and delay in reading and writing operations can be preventing, as in the first embodiment.

Fifth Embodiment

Figure 33:
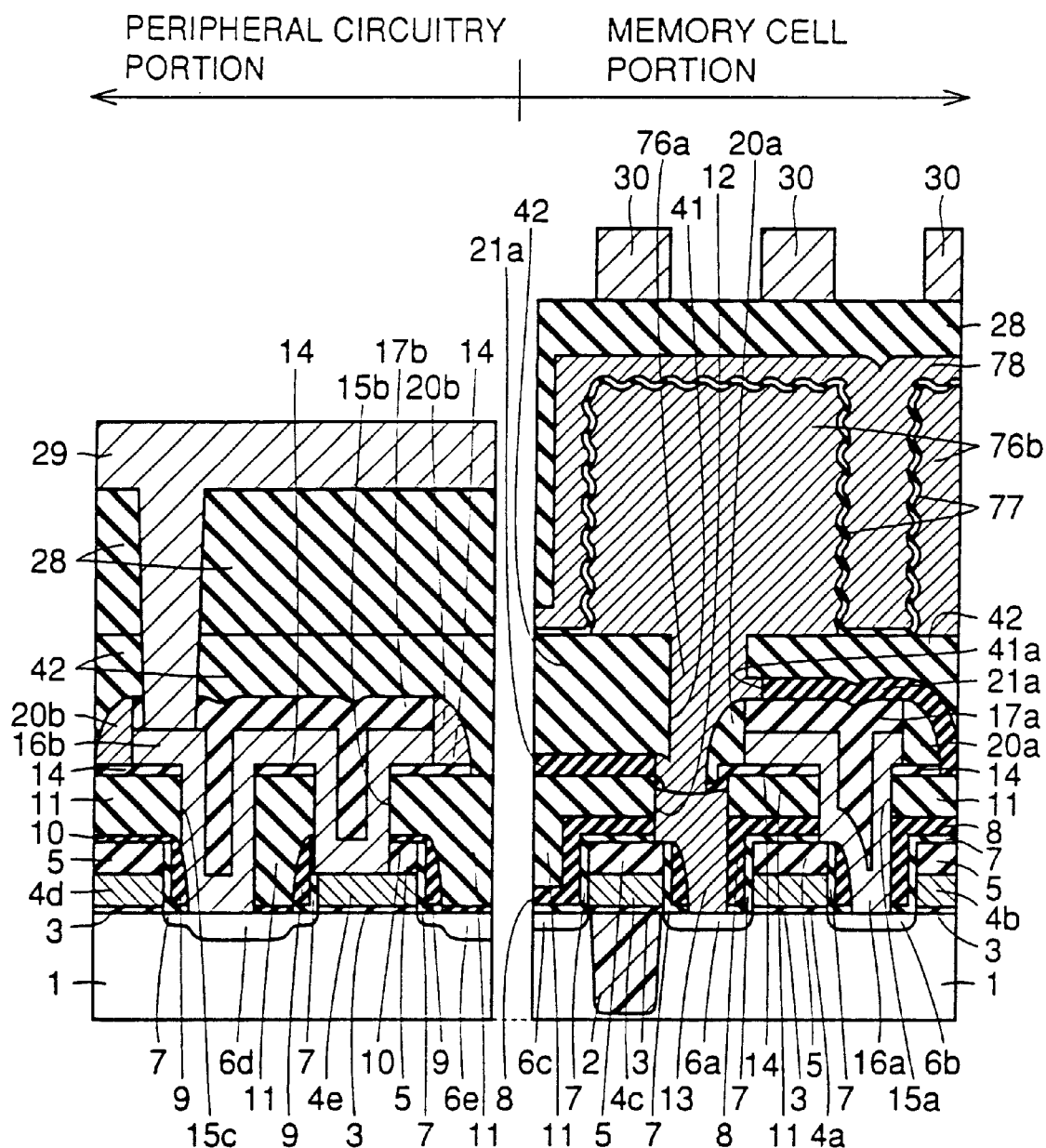
FIG. 33 is a cross sectional view showing a DRAM in accordance with a fifth embodiment of the present invention.

Referring to FIG. 33, a fifth embodiment is shown which has a capacitor portion modified from that of the second embodiment shown in FIG. 21. Specifically, in the fifth embodiment, a capacitor lower electrode portion 76b located on a capacitor contact portion 76a has a simple stacked type structure instead of a cylindrical structure. The surface of capacitor lower electrode portion 76b has an irregular shape. A capacitor upper electrode 78 is formed to cover capacitor lower electrode portion 76b with a capacitor dielectric film 77 located therebetween. By forming an irregular shaped surface of capacitor lower electrode portion 76b, capacitor capacitance can be increased.

Since capacitor contact portion 76a covers the side and top surfaces of bit line 16a as in the second embodiment above, capacitance between bit lines 16a can be reduced in the fifth embodiment. As a result, speed of data reading and writing operations can be improved. Further, provision of a plug electrode reduces the aspect ratios of first capacitor contact hole 12 and second capacitor contact hole 41. Accordingly, first capacitor contact hole 12 and second capacitor contact hole 41 can respectively be formed by the self aligned opening method using nitride films 8 and 21a. Therefore, the manufacturing process can be made simpler as compared with the case where a capacitance contact hole is formed by the diameter reduction process.

Sixth Embodiment

Figure 34:
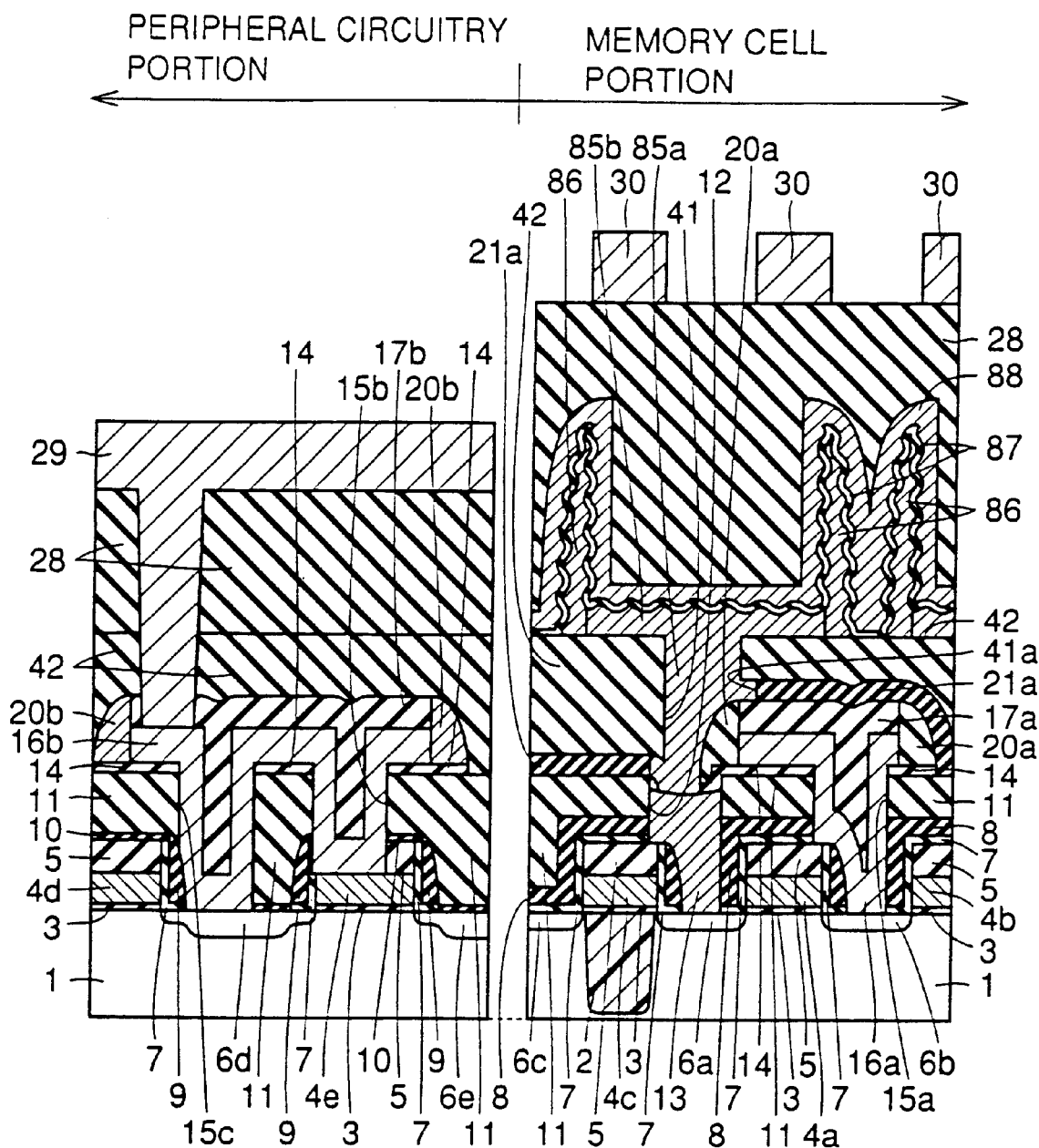
FIG. 34 is a cross sectional view showing a DRAM in accordance with a sixth embodiment of the present invention.
Figure 35:
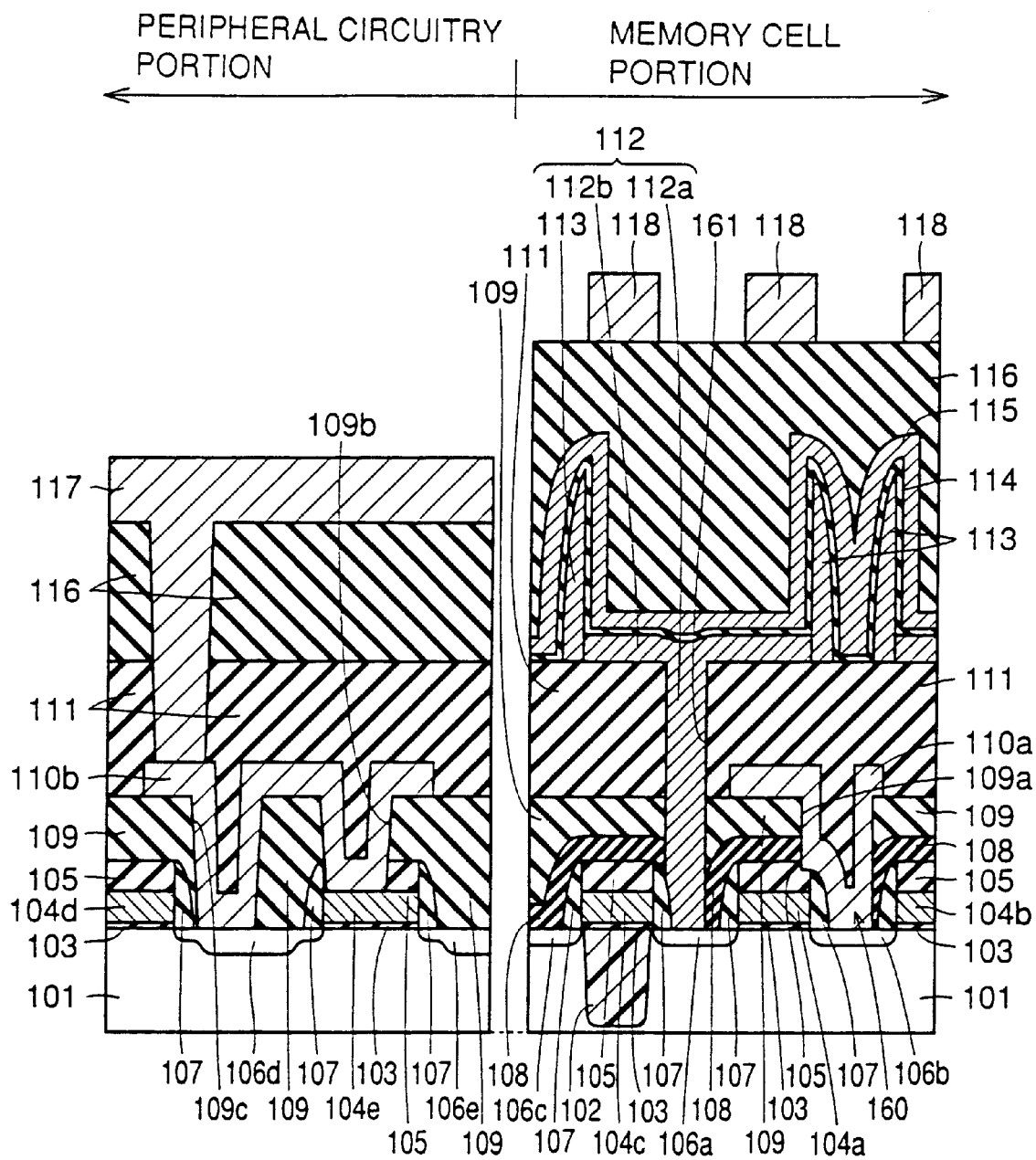
FIG. 35 is a cross sectional view showing a conventional DRAM.
Figure 36:
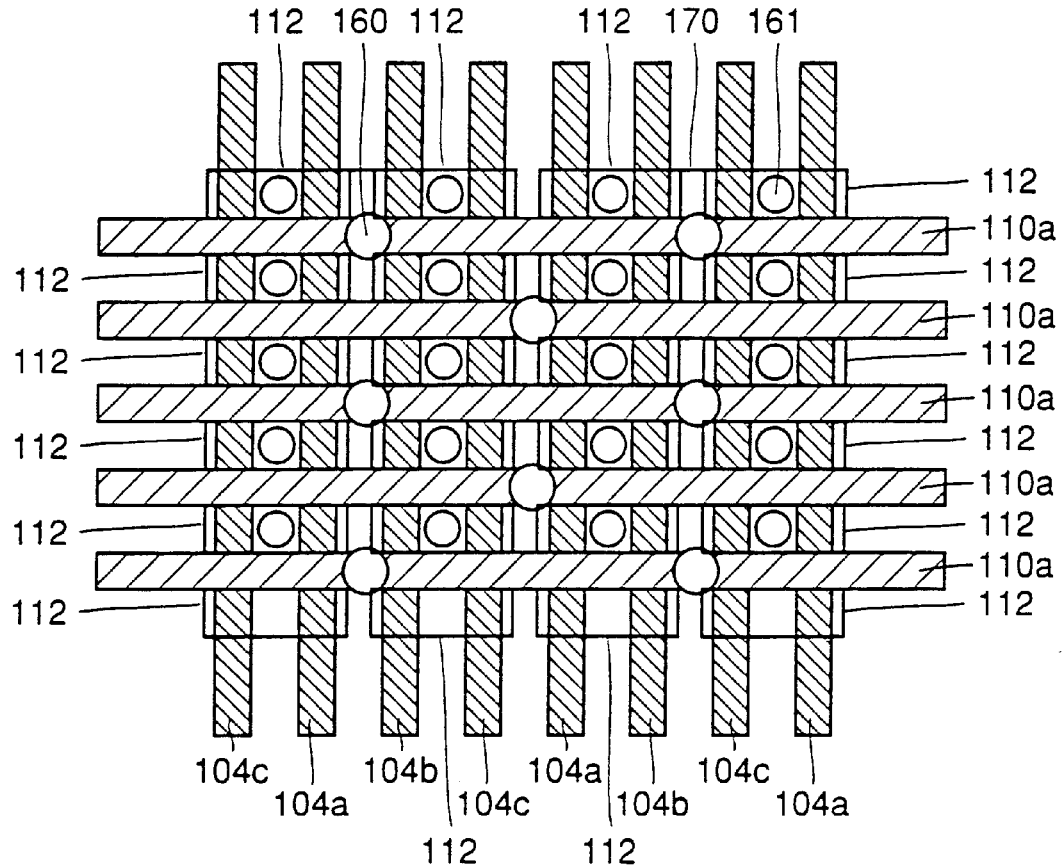
FIG. 36 is a ½ pitch layout of a memory cell portion of the conventional DRAM shown in FIG. 35.
Figure 37:
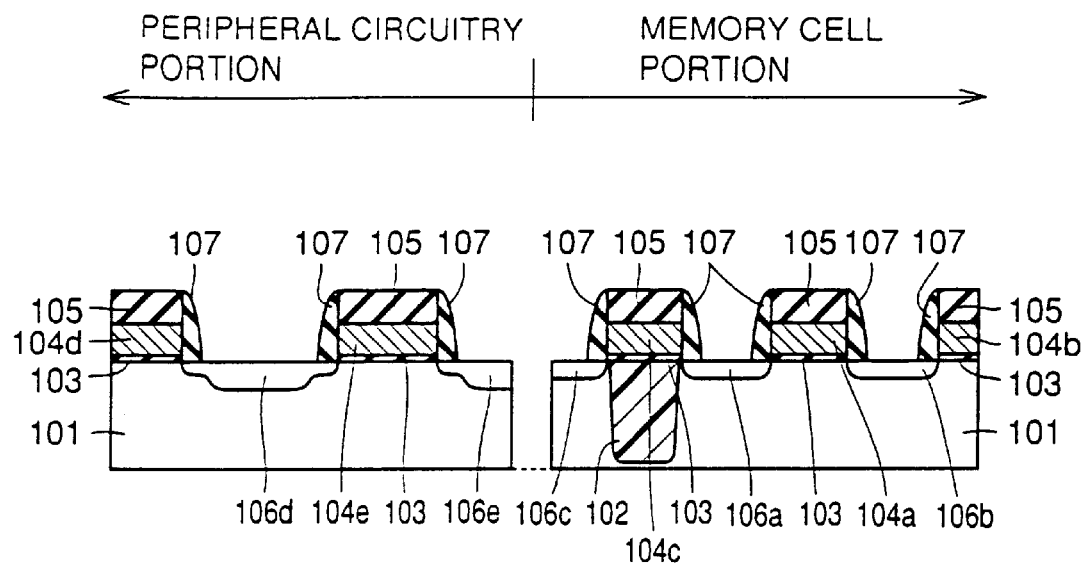
FIGS. 37 to 53 are cross sectional views illustrating a manufacturing process of the conventional DRAM shown in FIG. 35.
Figure 38:
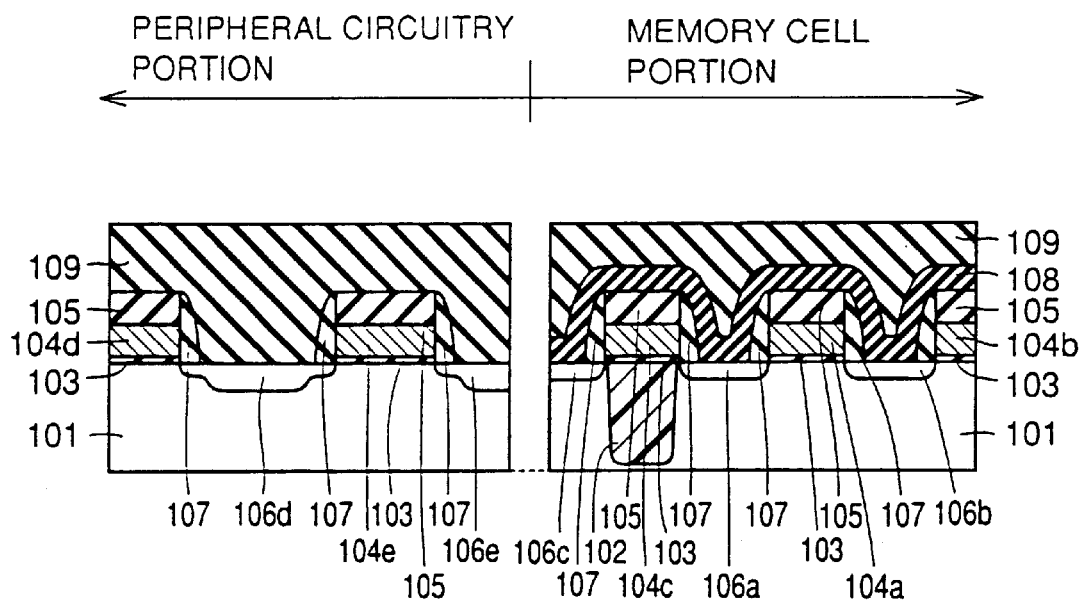
Figure 39:
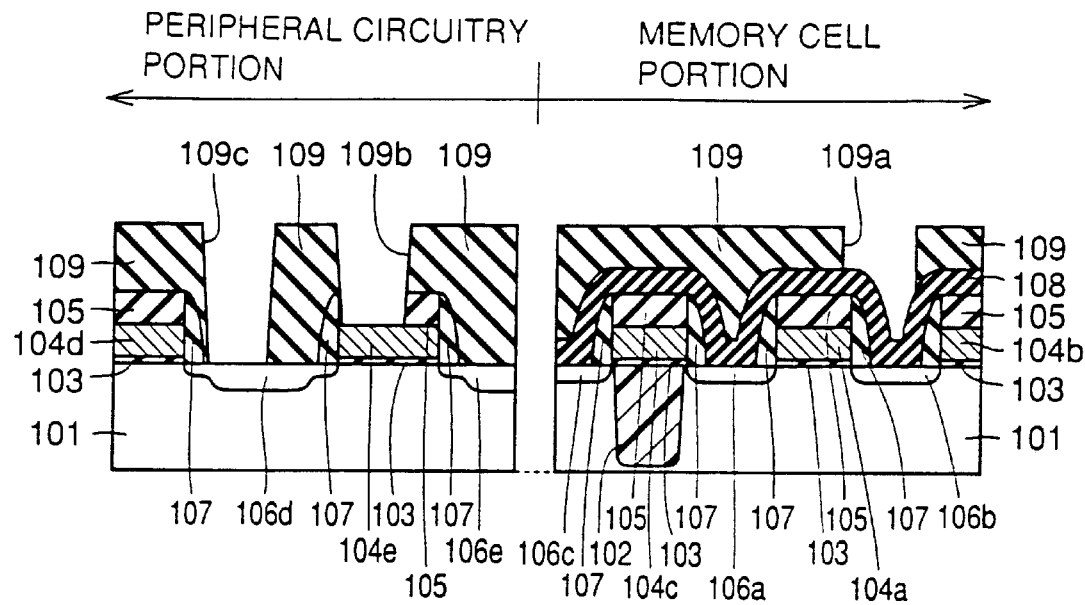
Figure 40:
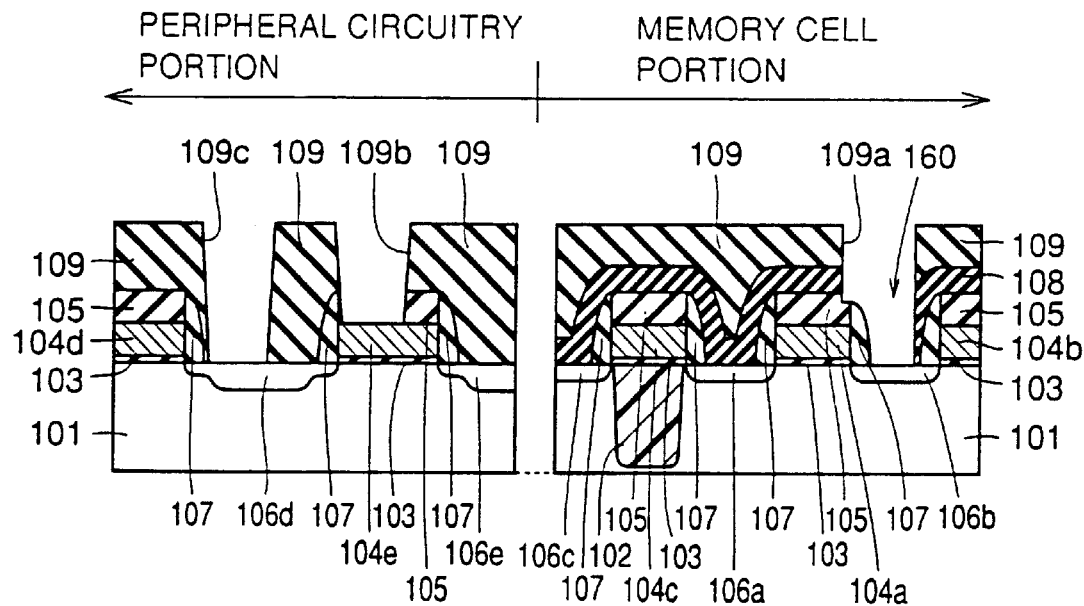
Figure 41:
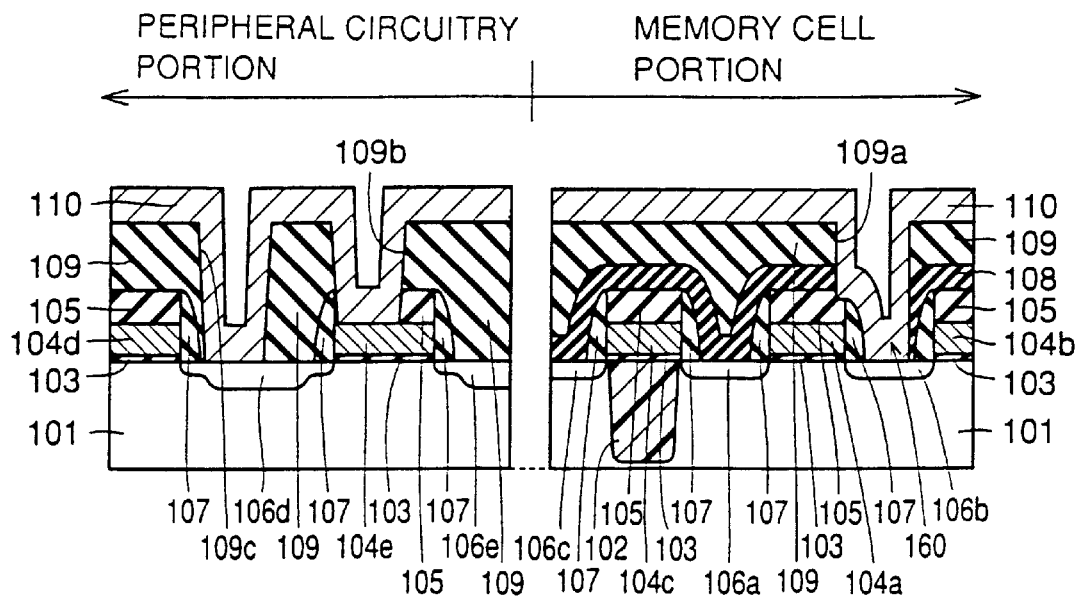
Figure 42:
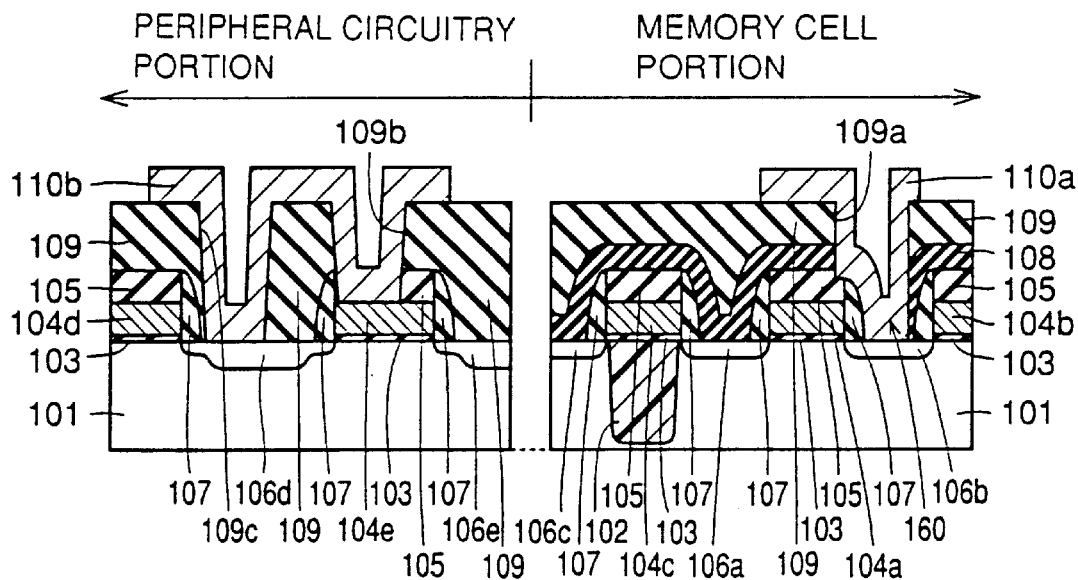
Figure 43:
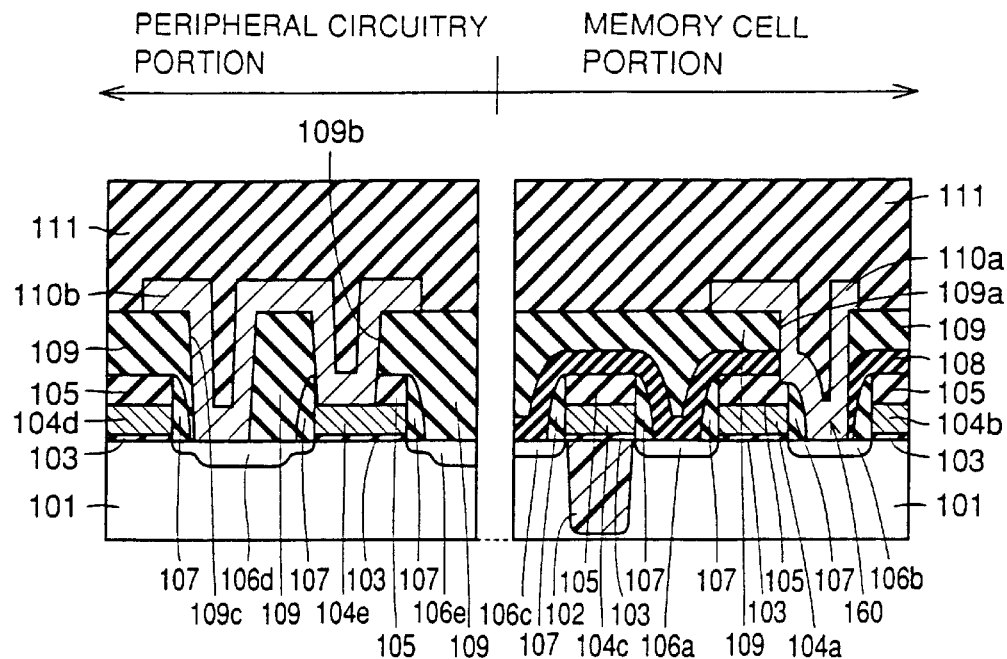

Referring to FIG. 34, a sixth embodiment has almost the same structure as the second embodiment shown in FIG. 21. In the sixth embodiment, however, a surface of a capacitor lower electrode portion 85b formed integrally with a capacitor contact portion 85a and a surface of a sidewall 86 of a polycrystalline silicon film are adapted to have an irregular shape. A capacitor upper electrode 88 is formed to cover capacitor lower electrode portion 85b and sidewall 86 with a capacitor dielectric film 87 located therebetween. Capacitor capacitance can be increased by thus forming irregular shaped surfaces of capacitor lower electrode portion 85b and sidewall 86 which constitute a capacitor lower electrode.

In the sixth embodiment, both of first capacitor contact hole 12 and second capacitor contact hole 41 can be formed by the self aligned opening method using silicon nitride films 8 and 21a, as in the second embodiment. Thus, the manufacturing process can be made simpler. In addition, capacitance between adjacent bit lines 16a can be reduced, thus operation speed can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor device, comprising:
first and second source/drain regions formed spaced apart with a channel region therebetween at a main surface of a semiconductor region;
a gate electrode formed on said channel region;
a first etch stop layer comprised of an insulating film formed over said gate electrode;
a first interlayer insulating film formed on said first etch stop layer;
a bit line opening formed in a region of said first interlayer insulating film and said first etch stop layer located on said first source/drain region;
a first capacitor opening formed in a region of said first interlayer insulating film and said first etch stop layer located on said second source/drain region;

a bit line connected to said first source/drain region through said bit line opening;

a plug electrode connected to said second source/drain region through said first capacitor opening and filling said first capacitor opening, and having its top surface area larger than its bottom surface area; and a conductive layer having a vertically extending capacitor contact portion electrically connected to the top surface of said plug electrode, and a capacitor lower electrode formed integrally with the top of said capacitor contact portion, said lower electrode having a pair of vertically extending parts at opposite ends of a horizontal region, wherein the capacitor contact portion of said conductive layer has a horizontally extending part formed to cover top and side surfaces of said bit line with a first insulating film located therebetween.

2. The semiconductor device according to claim 1, wherein said first insulating film includes:

an upper insulating film formed in contact with the top surface of said bit line, and a sidewall insulating film formed in contact with the side surface of said bit line and a side surface of said upper insulating film, and the top surface of said bit line is located above the top surface of said plug electrode.

3. The semiconductor device according to claim 1, wherein the surface of said capacitor lower electrode has an irregular shape.

4. A semiconductor device, comprising:

first and second source/drain regions formed spaced apart with a channel region therebetween at a main surface of a semiconductor region;

a gate electrode formed on said channel region;

a first etch stop layer comprised of an insulating film formed over said gate electrode;

a first interlayer insulating film formed on said first etch stop layer;

a bit line opening formed in a region of said first interlayer insulating film and said first etch stop layer located on said first source/drain region;

a first capacitor opening formed in a region of said first interlayer insulating film and said first etch stop layer located on said second source/drain region;

a bit line connected to said first source/drain region through said bit line opening;

a plug electrode connected to said second source/drain region through said first capacitor opening and filling said first capacitor opening, and having its top surface area larger than its bottom surface area;

a conductive layer having a capacitor contact portion electrically connected to the top surface of said plug electrode and extending vertically, and a capacitor lower electrode formed integrally with the top of said capacitor contact portion and extending horizontally, wherein the capacitor contact portion of said conductive layer has a horizontally extending part and is formed to cover top and side surfaces of said bit line with a first insulating film located therebetween;

a second etch stop layer comprised of an insulating film formed on said first interlayer insulating film and said first insulating film;

a second interlayer insulating film formed on said second etch stop layer; and a second capacitor opening formed in said second interlayer insulating film and said second etch stop layer to reach the first capacitor opening, wherein:

an end of said second etch stop layer located between said second interlayer insulating film and said first insulating film is removed on a side of said second capacitor opening to form a concave portion on a top side end of said bit line, said capacitor contact portion is formed to fill said second capacitor opening and said concave portion and to extend over said bit line, and said capacitor lower electrode is formed to extend along a top surface of said second interlayer insulating film.

* * * * *

UNITED STATES PATENT AND TRADEMARK OFFICE
CERTIFICATE OF CORRECTION

PATENT NO.   : 6,472,704 B2
DATED         : October 29, 2002
INVENTOR(S)  : Hiroki Shinkawata It is certified that error appears in the above-identified patent and that said Letters Patent is hereby corrected as shown below:

<u>Title page,</u>
Item [62], Related U.S. Application Data, change "09/975,160" to -- 08/975,160 --

Signed and Sealed this

Sixth Day of May, 2003

JAMES E. ROGAN
*Director of the United States Patent and Trademark Office*